US012261190B2

(12) United States Patent
Chen et al.

(10) Patent No.: US 12,261,190 B2
(45) Date of Patent: Mar. 25, 2025

(54) VERTICALLY STACKED LIGHT SENSORS

(71) Applicant: Taiwan Semiconductor Manufacturing Company, Ltd., Hsinchu (TW)

(72) Inventors: Hsiang-Lin Chen, Hsinchu County (TW); Yi-Shin Chu, Hsinchu (TW); Yin-Kai Liao, Taipei (TW); Sin-Yi Jiang, Hsinchu (TW); Sung-Wen Huang Chen, Nantou County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/363,950

(22) Filed: Aug. 2, 2023

(65) Prior Publication Data

US 2024/0363672 A1 Oct. 31, 2024

Related U.S. Application Data

(60) Provisional application No. 63/498,309, filed on Apr. 26, 2023.

(51) Int. Cl.
*H01L 27/148* (2006.01)
*H01L 27/146* (2006.01)

(52) U.S. Cl.
CPC .. *H01L 27/14825* (2013.01); *H01L 27/14621* (2013.01); *H01L 27/14625* (2013.01); *H01L 27/14636* (2013.01); *H01L 27/14687* (2013.01); *H01L 27/14806* (2013.01)

(58) Field of Classification Search
CPC ........ H01L 27/14825; H01L 27/14621; H01L 27/14625; H01L 27/14636; H01L 27/14687; H01L 27/14806
See application file for complete search history.

(56) References Cited

U.S. PATENT DOCUMENTS

2017/0117310 A1 4/2017 Tatani et al.
2023/0054279 A1* 2/2023 Wang ................ H01L 31/02363

FOREIGN PATENT DOCUMENTS

CN 110190077 A 8/2019
WO 2016051594 A1 4/2016

* cited by examiner

*Primary Examiner* — Tony Ko
(74) *Attorney, Agent, or Firm* — Eschweiler & Potashnik, LLC

(57) ABSTRACT

Various embodiments of the present disclosure are directed towards a semiconductor structure including a first substrate comprising a first semiconductor material. A first light sensor is disposed within the first substrate. The first light sensor is configured to absorb electromagnetic radiation within a first wavelength range. A second light sensor is disposed within an absorption structure underlying the first substrate. The second light sensor is configured to absorb electromagnetic radiation within a second wavelength range different from the first wavelength range. The absorption structure underlies the first light sensor and comprises a second semiconductor material different from the first semiconductor material.

20 Claims, 27 Drawing Sheets

VERTICALLY STACKED LIGHT SENSORS

REFERENCE TO RELATED APPLICATION

This application claims the benefit of U.S. Provisional Application No. 63/498,309, filed on Apr. 26, 2023, the contents of which are incorporated herein by reference in their entirety.

BACKGROUND

Integrated chips (ICs) with image sensors are used in a wide range of modern-day electronic devices. The image sensors comprise one or more photodetectors (e.g., photodiodes, phototransistors, photoresistors, etc.) configured to absorb incident light and output electrical signals corresponding to the incident light. Some types of image sensors include charge-coupled device (CCD) image sensors and complementary metal-oxide-semiconductor (CMOS) image sensors. Compared to CCD image sensors, CMOS image sensors are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
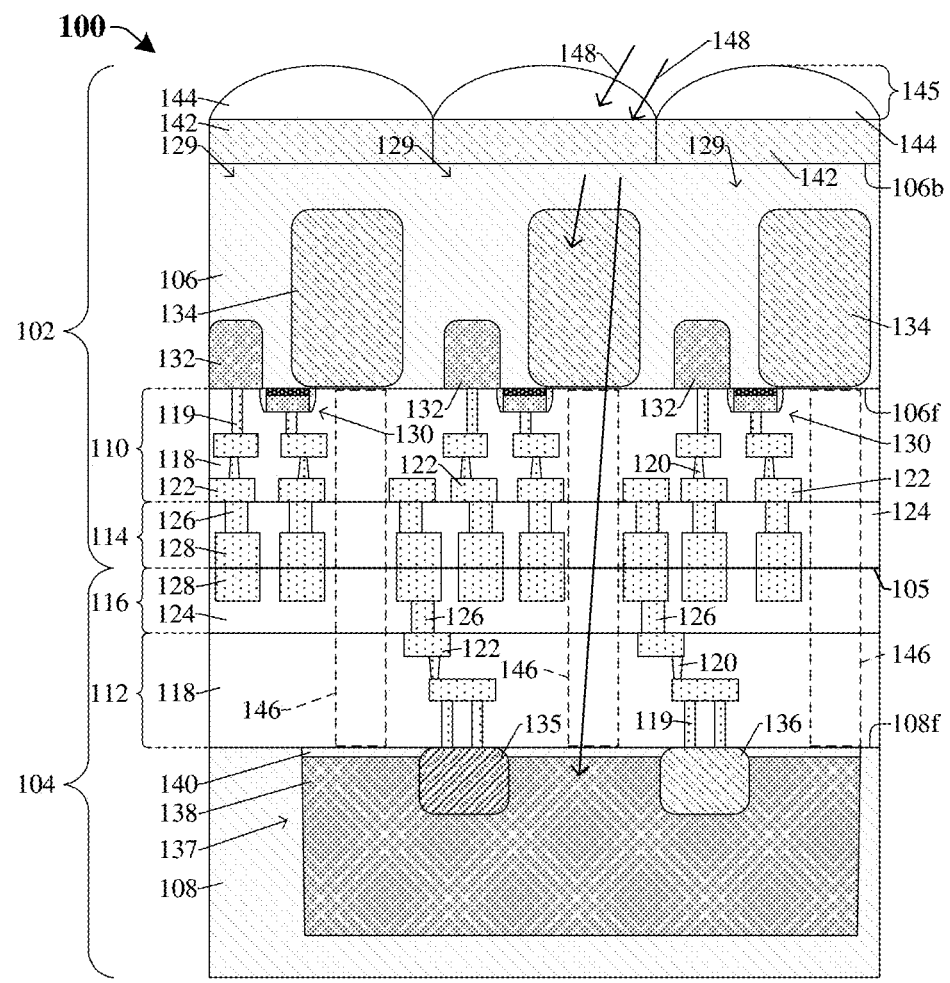
FIG. 1 illustrates a cross-sectional view of some embodiments of a stacked integrated chip (IC) structure comprising a first light sensor over a second light sensor, where the first and second light sensors are configured to absorb different wavelength ranges of electromagnetic radiation.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A complementary metal-oxide semiconductor (CMOS) image sensor (CIS) may include a plurality of image sensors disposed on a substrate. The image sensors are each configured to generate electrical signals from incident light. A lens structure overlies the substrate and is configured to direct the incident light towards the image sensors. Further, an interconnect structure and/or one or more semiconductor devices (e.g., transfer transistors, etc.) are disposed on the substrate and are configured to facilitate readout of the generated electrical signals.

The image sensors may be configured to generate electrical signals from light within a specific range of wavelengths. For example, the image sensors may be disposed within a silicon substrate, which has a high absorption coefficient for light within the visible light spectrum (e.g., light having a wavelength within a range of approximately 380 nm to approximately 700 nm). Accordingly, image sensors disposed within the silicon substrate increase the performance of visible light sensing. However, the absorption coefficient of silicon decreases as the wavelength of light increases. Image sensors disposed within germanium provide a better option for light within the infrared (IR)

range (e.g., light having a wavelength within a range of approximately 900 nm to 3,000 nm) because germanium has a higher absorption of IR light compared to silicon (e.g., due to germanium having a smaller bandgap than silicon). As a result, image sensors disposed within germanium increase the performance of IR light sensing. Thus, in order to efficiently sense light in two or more wavelength ranges (e.g., the visible light range, IR range, etc.), two or more CISs respectively comprising image sensors, light filters, microlenses, or the like may be utilized, thereby increasing fabrication costs. Further, in some instances, the two or more CISs may be disposed laterally adjacent to one another on a package structure, such that the CISs occupy a relatively large lateral footprint.

Various embodiments of the present application are directed towards a stacked integrated chip (IC) structure comprising a first IC chip having a plurality of visible light sensors vertically stacked with a second IC chip having a plurality of IR light sensors. The first IC chip includes a first substrate comprising a first semiconductor material (e.g., silicon) with a high absorption coefficient for visible light. The visible light sensors are disposed within the first substrate. The second IC chip includes one or more absorption structures disposed on and/or within a second substrate, where the absorption structures comprise a second semiconductor material (e.g., germanium) which has a high absorption coefficient for infrared radiation (IR) light. The IR light sensors are disposed within a corresponding absorption structure. The first and second IC chips respectively comprise an interconnect structure and bond structure. The first and second IC chips meet at a bond interface disposed vertically between the first and second substrates and a single lens structure overlies the first and second IC chips. Thus, the visible light sensors are vertically stacked with the IR light sensors, such that the stacked IC structure may efficiently sense light in two or more wavelength ranges while reducing a lateral footprint and fabrication costs.

FIG. 1 illustrates a cross-sectional view 100 of some embodiments of a stacked integrated chip (IC) structure comprising a first light sensor over a second light sensor, where the first and second light sensors are configured to absorb different wavelength ranges of electromagnetic radiation.

The stacked IC structure includes a first IC chip 102 stacked vertically with a second IC chip 104. The first IC chip 102 includes a first substrate 106 and the second IC chip 104 includes a second substrate 108. The first and second substrates 106, 108 respectively comprise a first semiconductor material and/or may each comprise a first doping type (e.g., p-type). In some embodiments, the first semiconductor material may, for example, be or comprise silicon, epitaxial silicon, or the like. Further, the first IC chip 102 comprises a plurality of first light sensors 129 and the second IC chip 104 comprises one or more second light sensors 137. The plurality of first light sensors 129 and the one or more second light sensors 137 are respectively configured to absorb electromagnetic radiation 148 and generate corresponding electrical signals. The plurality of first light sensors 129 are configured to absorb the electromagnetic radiation 148 within a first wavelength range and the one or more second light sensors 137 are configured to absorb the electromagnetic radiation 148 within a second wavelength range different from the first wavelength range. For example, the plurality of first light sensors 129 are configured to absorb visible light and the one or more second light sensors 137 are configured to absorb infrared (IR) light (e.g., near IR (NIR) light, short-wave IR (SWIR) light, etc.). In some embodiments, the first wavelength range includes electromagnetic radiation having a wavelength within a range of approximately 380 nm to approximately 700 nm. In various embodiments, the second wavelength range includes electromagnetic radiation having a wavelength within a range of approximately 900 nm to approximately 2,500 nm, within a range of approximately 1,400 nm to approximately 3,000 nm, or some other suitable value.

The first IC chip 102 further includes a first interconnect structure 110 and a first bond structure 114 disposed on a front-side surface 106f of the first substrate 106. The second IC chip 104 further includes a second interconnect structure 112 and a second bond structure 116 disposed on a front-side surface 108f of the second substrate 108. The first and second interconnect structures 110, 112 respectively comprise a plurality of metallization structures 119, 120, 122 (e.g., metal contacts, metal vias, metal wires, etc.) disposed within an interconnect dielectric structure 118. The first and second bond structures 114, 116 respectively comprise conductive bond structures 126, 128 disposed within a dielectric bond structure 124. The first and second IC chips 102, 104 meet at a bond interface 105, where the first bond structure 114 is bonded to the second bond structure 116. The first and second interconnect structures 110, 112 are electrically coupled to one another by way of the first and second bond structures 114, 116. A plurality of light filters 142 (e.g., color filters or the like) are disposed on a back-side surface 106b of the first substrate 106. The light filters 142 are configured to transmit specific wavelengths of the electromagnetic radiation 148 to the first and second light sensors 129, 137. Further, an upper light guide structure 145 is disposed on the plurality of light filters 142. In some embodiments, the upper light guide structure 145 comprises a plurality of microlenses 144 that are configured to focus the electromagnetic radiation 148 towards the first and second light sensors 129, 137.

The plurality of first light sensors 129 respectively comprise a doped photodetector region 134 disposed in the first substrate 106. The doped photodetector region 134 has a second doping type (e.g., n-type) opposite the first doping type (e.g., p-type) of regions of the first substrate 106 abutting the doped photodetector region 134. In some embodiments, the first doping type is p-type and the second doping type is n-type, or vice versa. Accordingly, in some embodiments, the plurality of first light sensors 129 respectively comprise and/or are configured as a photodiode such as, for example, a PN photodiode, a PIN photodiode, or the like. In various embodiments, by virtue of the first light sensors 129 respectively comprising the doped photodetector region 134 disposed in the first substrate 106, where the first substrate 106 comprises the first semiconductor material (e.g., silicon), the first light sensors 129 have a high absorption coefficient for the electromagnetic radiation 148 within the first wavelength range (e.g., visible light).

Further, a plurality of floating diffusion nodes 132 are disposed within the first substrate 106. The floating diffusion nodes 132 have the second doping type (e.g., n-type). A plurality of pixel devices 130 are disposed on the front-side surface 106f of the first substrate 106. In various embodiments, the floating diffusion nodes 132 and the plurality of pixel devices 130 are configured to facilitate readout of electrical signals generated by the first light sensors 129, where the electrical signals correspond to absorbed light within the first wavelength range.

The one or more second light sensors 137 comprise an absorption structure 138 and first and second doped regions 135, 136 disposed within the absorption structure 138. In some embodiments, the first doped region 135 and the second doped region 136 have opposite doping types. For example, the first doped region 135 comprises the first doping type (e.g., p-type) and the second doped region 136 comprises the second doping type (e.g., n-type). The one or more second light sensors 137 may be configured as or comprise a photodiode such as, for example, a PN photodiode, a PIN photodiode, an avalanche photodiode, or the like. The absorption structure 138 comprises a second semiconductor material (e.g., germanium) different from the first semiconductor material (e.g., silicon) of the first substrate 106. The second semiconductor material may, for example, be or comprise germanium or the like. By virtue of the one or more second light sensors 137 having the absorption structure 138 with the second semiconductor material (e.g., germanium), the one or more second light sensors 137 have a high absorption coefficient for the electromagnetic radiation 148 within the second wavelength range (e.g., IR light, NIR light, SWIR light, etc.). This, in part, is because a band gap of the second material (e.g., germanium) of the absorption structure 138 is smaller than that of the first semiconductor material (e.g., silicon) of the first substrate 106.

Figure 3A:
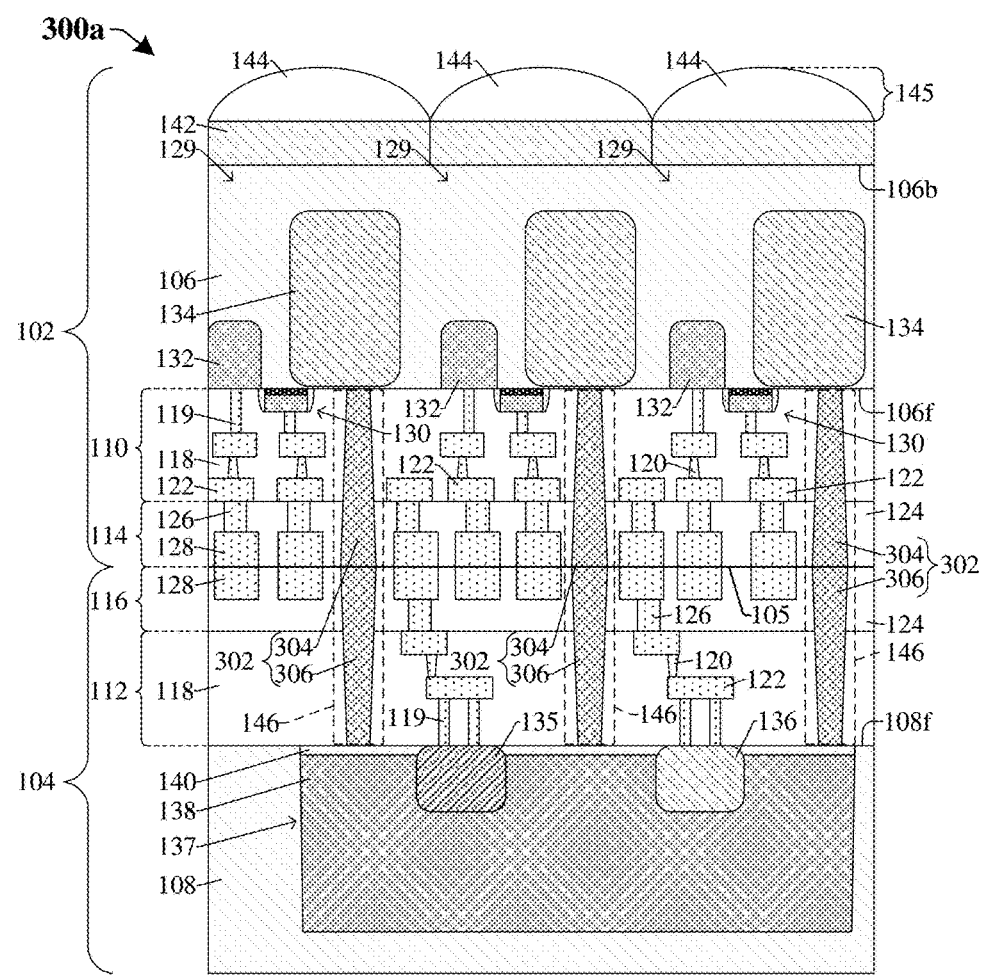
FIG. 3A illustrates a cross-sectional view of some other embodiments of a stacked integrated chip (IC) structure comprising a first light sensor over a second light sensor, where the first and second light sensors are configured to absorb different wavelength ranges of electromagnetic radiation.
Figure 3B:
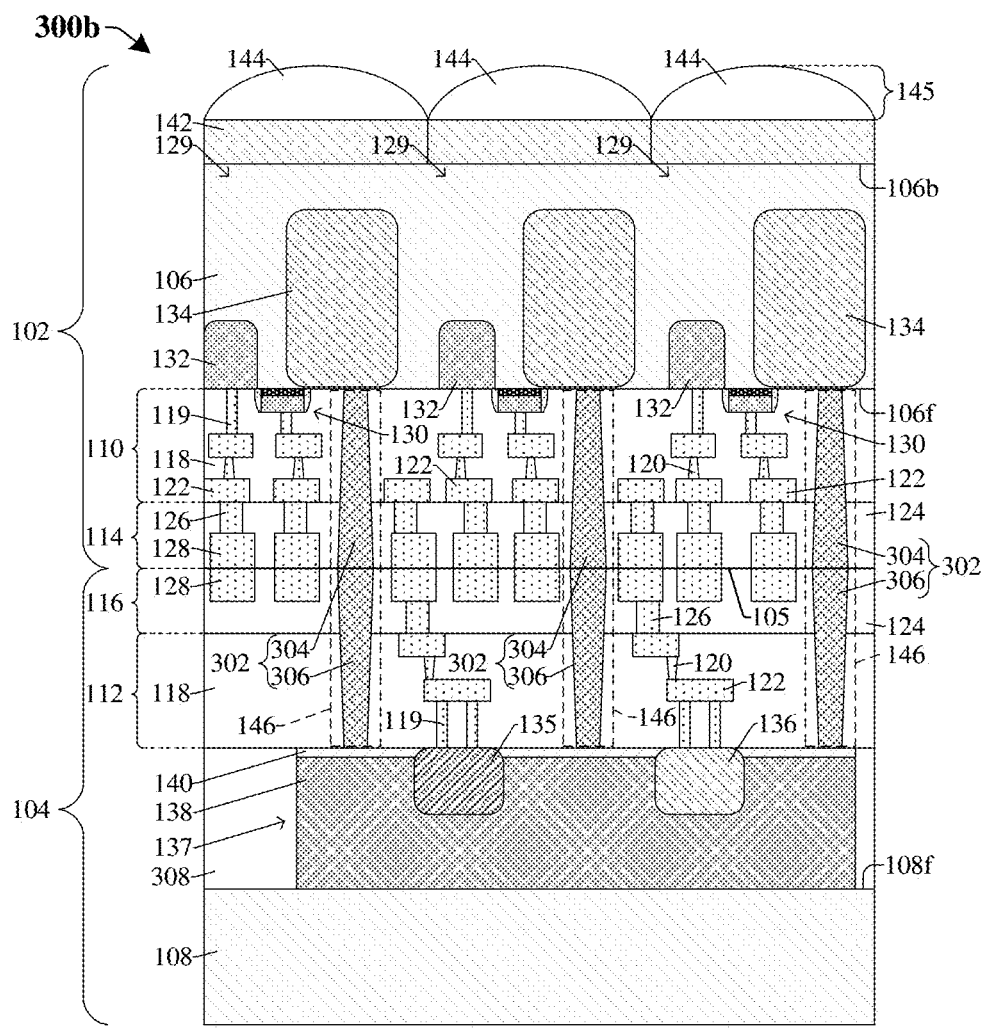
FIGS. 3B-3D illustrate cross-sectional views of some alternative embodiments of the stacked IC structure of FIG. 3A.
Figure 3C:
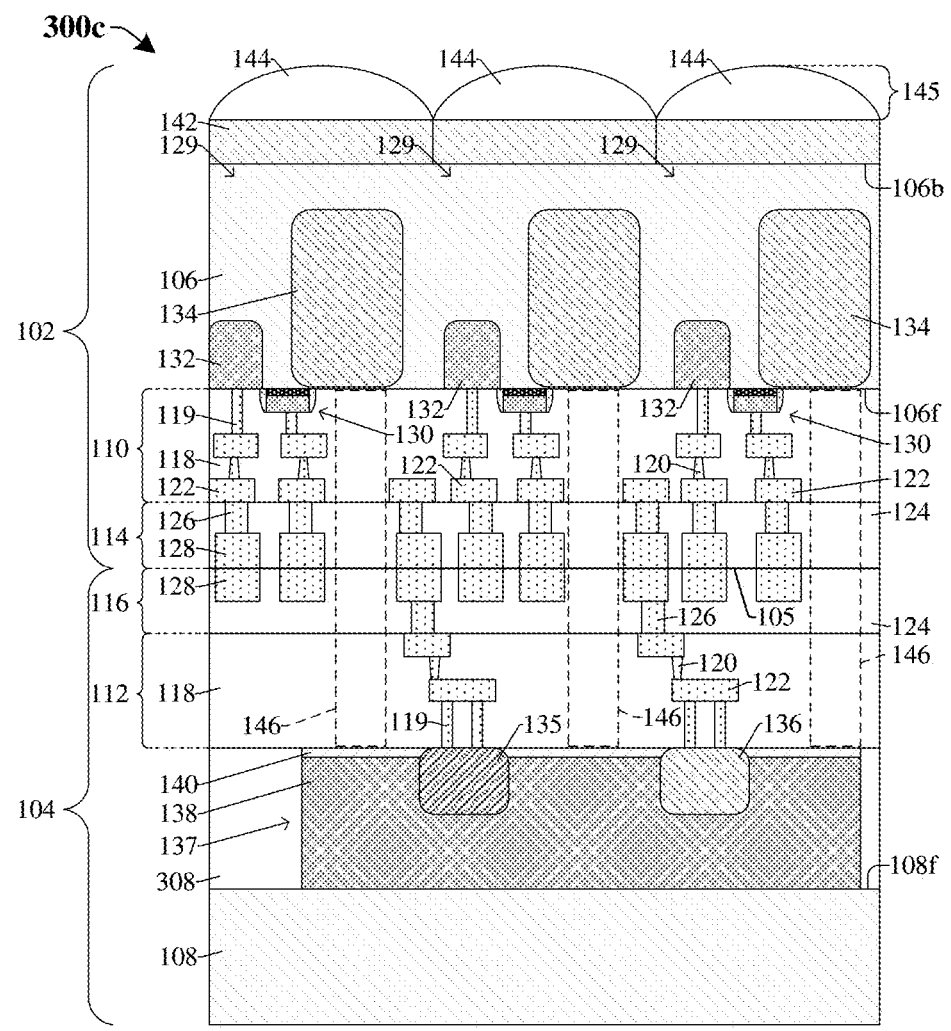
Figure 3D:
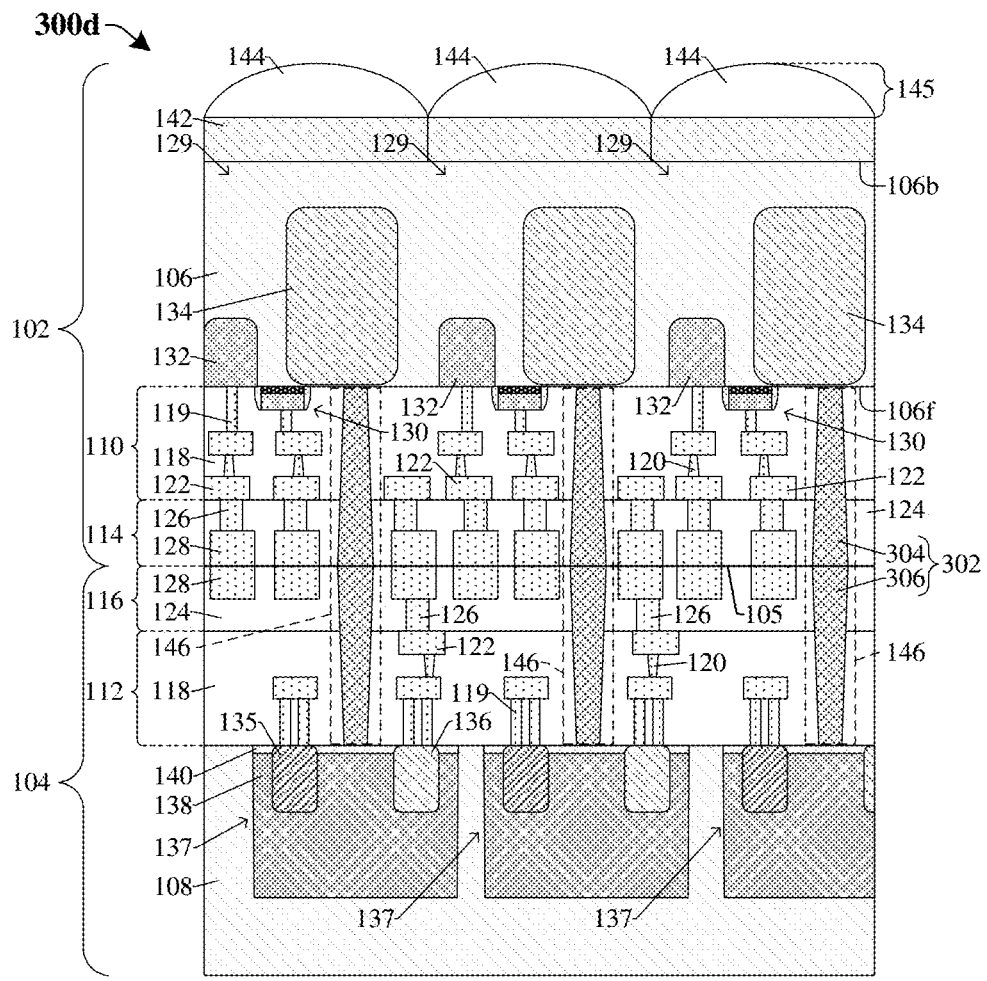

It will be appreciated that while FIG. 1 illustrates the stacked IC structure comprising a single second light sensor 137, this is merely a non-limiting example and the second IC chip 104 may comprise any number of second light sensors 137 that each comprise a corresponding absorption structure 138 and first and second doped regions 135, 136 (e.g., as illustrated in FIG. 3D). For example, the second IC chip 104 may comprise an array of second light sensors 137 disposed in a plurality of columns and a plurality of rows, where one or more of the first light sensors 129 directly overlie each second light sensor 137.

By virtue of the plurality of first light sensors 129 being disposed within the first substrate 106 (e.g., comprising silicon) and overlying the one or more second light sensors 137 having the absorption structure 138 (e.g., comprising germanium), the stacked IC structure comprises two or more light sensors that efficiently absorb different wavelength ranges of the electromagnetic radiation 148. Further, vertically stacking the first IC chip 102 with the second IC chip 104 facilitates increasing a number of light sensors that may be disposed in a lateral area and facilitates the stacked IC structure having an individual upper light guide structure 145. Thus, the stacked IC structure may efficiently sense light in two or more wavelength ranges while increasing the device density and reducing fabrication costs.

In various embodiments, the second substrate 108 comprises one or more surfaces that define a recess extending into the front-side surface 108f of the second substrate 108. The absorption structure 138 is disposed within the recess. Further, a capping layer 140 extends over a top surface of the absorption structure 138. In various embodiments, a top surface of the absorption structure 138 is recessed below the front-side surface 108f of the second substrate 108 and the capping layer 140 extends along the recessed top surface of the absorption structure 138. In some embodiments, a top surface of the capping layer 140 is aligned with the front-side surface 108f of the second substrate 108.

In yet further embodiments, a plurality of light guide regions 146 are disposed in the first and second interconnect structures 110, 112 and the first and second bond structures 114, 116. The light guide regions 146 continuously extend from the plurality of first light sensors 129 to a corresponding second light sensor 137. For example, each light guide region 146 may continuously extend from the doped photodetector region 134 of a corresponding first light sensor 129 to over the absorption structure 138. The plurality of light guide regions 146 extend in a direction orthogonal to the front-side surface 106f of the first substrate 106 towards the second substrate 108. In various embodiments, the plurality of light guide regions 146 are regions of the first and second interconnect structures 110, 112 and the first and second bond structures 114 that are devoid of the metallization structures 119, 120, 122 and the conductive bond structures 126, 128. For example, the plurality of light guide regions 146 may comprise one or more dielectric materials and are completely devoid of the metallization structures 119, 120, 122 and the conductive bond structures 126, 128. As a result, at least a portion of the electromagnetic radiation 148 may travel through the first substrate 106, the first and second interconnect structures 110, 112, and the first and second bond structures 114, 116 (e.g., through the light guide regions 146) to the one or more second light sensors 137.

Figure 2:
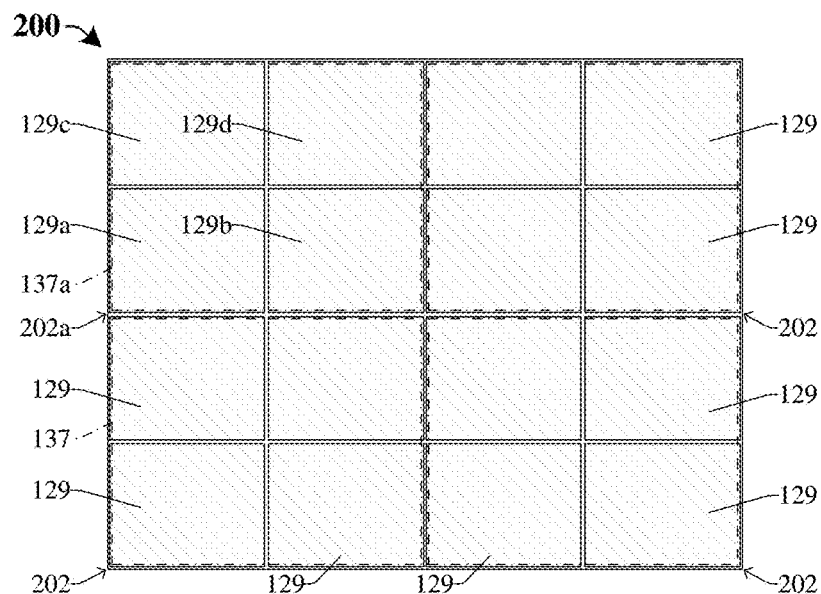
FIG. 2 illustrates a top layout view of some embodiments of the stacked IC structure of FIG. 1.

FIG. 2 illustrates a top layout view 200 of some embodiments of the stacked IC structure of FIG. 1.

In some embodiments, the stacked IC structure comprises a plurality of pixels 202 that respectively comprise a plurality of first light sensors 129 and at least one second light sensor 137. In various embodiments, the first light sensors 129 of each pixel 202 may have a 2×2 layout that is arranged in a Bayer pattern. For example, a first pixel 202a comprises a first subset of the first light sensors 129a-d comprising a blue light sensor 129a, a first green light sensor 129b, a second green light sensor 129c, and a red light sensor 129d. In various embodiments, the first pixel 202a comprises an individual second light sensor 137a that underlies the first light sensors 129a-d. It will be appreciated that the light sensors of each pixel 202 may have other layouts, such as a 2×1 layout, a 4×2 layout, a 4×4 layout, or the like. Further, the light sensors of each pixel 202 may have combinations of layouts between the first light sensors 129 and the second light sensor 137. In yet further embodiments, a size of the absorption structure (e.g., 138 of FIG. 1) of each second light sensor 137 may be approximately equal to a size of the overlying first light sensors 129 of the corresponding pixel 202. For example, when viewed in top view, an area of the absorption structure (e.g., 138 of FIG. 1) of the individual second light sensor 137a may be approximately equal to an area of the first light sensors 129a-d.

FIG. 3A illustrates a cross-sectional view 300a of some other embodiments of a stacked IC structure comprising a first light sensor over a second light sensor, where the first and second light sensors are configured to absorb different wavelength ranges of electromagnetic radiation.

The stacked IC structure comprises a first IC chip 102 bonded to a second IC chip 104. The first IC chip 102 comprises a first substrate 106, a first interconnect structure 110, and a first bond structure 114. The second IC structure comprises a second substrate 108, a second interconnect structure 112, and a second bond structure 116. The first and second substrates 106, 108 may, for example, each be or comprise silicon, monocrystalline silicon, CMOS bulk, epitaxial silicon, a silicon-on-insulator (SOI) substrate, some other suitable substrate material, or any combination of the foregoing. In some embodiments, the first and second substrates 106, 108 comprise a first semiconductor material (e.g., silicon) having a first doping type (e.g., p-type).

The first and second interconnect structures 110, 112 respectively comprise an interconnect dielectric structure 118, a plurality of conductive contacts 119, a plurality of conductive vias 120, and a plurality of conductive wires 122. The interconnect dielectric structure 118 may comprise a plurality of dielectric layers that may, for example, be or comprise silicon dioxide, a low-k dielectric material, some other dielectric material, or any combination of the foregoing. As used herein, a low-k dielectric material is a dielectric material with a dielectric constant less than about 3.9. The conductive contacts, vias, and wires 119, 120, 122 may, for example, be or comprise tungsten, copper, aluminum, titanium nitride, tantalum nitride, ruthenium, some other conductive material, or any combination of the foregoing.

The first and second bond structures 114, 116 respectively comprise a plurality of bond contacts 126, a plurality of bond pads 128, and a dielectric bond structure 124. The first and second bond structures 114, 116 meet at a bond interface 105 that include dielectric-to-dielectric bonds, conductor-to-conductor bonds, or the like. The dielectric bond structure 124 comprises one or more dielectric layers that may, for example, be or comprise silicon dioxide, silicon carbide, silicon nitride, silicon oxynitride, some other dielectric material, or any combination of the foregoing. The bond contacts and pads 126, 128 may, for example, be or comprise copper, tungsten, titanium, tantalum, some other conductive material, or any combination of the foregoing. The first IC chip 102 is electrically coupled to the second IC chip 104 by way of the first and second bond structures 114, 116 and the first and second interconnect structures 110, 112.

A plurality of first light sensors 129 are disposed within the first substrate 106 and respectively comprise a doped photodetector region 134. In various embodiments, the doped photodetector region 134 is a portion of the first substrate 106 having a second doping type (e.g., n-type) opposite the first doping type (e.g., p-type). Further, a plurality of floating diffusion nodes 132 are disposed within the first substrate 106 adjacent to at least one doped photodetector region 134. The floating diffusion nodes have the second doping type (e.g., n-type, and may, for example, have a higher doping concentration than that of the doped photodetector region 134. A plurality of pixel devices 130 are disposed on a front-side surface 106f of the first substrate 106. In some embodiments, the plurality of pixel devices 130 comprise transfer transistor(s), reset transistor(s), source-follower transistor(s), select transistor(s), other suitable devices, or the like. The first light sensors 129 are configured to absorb electromagnetic radiation within a first wavelength range (e.g., visible light). Further, the pixel devices 130 are configured to facilitate readout of electrical signals generated from the electromagnetic radiation absorbed by the first light sensors 129.

One or more second light sensors 137 are disposed within and/or on the second substrate 108 and underlie the plurality of first light sensors 129. In some embodiments, the one or more second light sensors 137 respectively comprise an absorption structure 138 disposed in the second substrate 108 and first and second doped regions 135, 136. The absorption structure 138 comprises a second semiconductor material (e.g., germanium) different from the first semiconductor material (e.g., silicon). Further, a capping layer 140 extends along a top surface of the absorption structure 138. In some embodiments, the capping layer 140 comprises the first semiconductor material (e.g., silicon) or some other suitable material. In various embodiments, the first and second doped regions 135, 136 continuously extend from the capping layer 140 to below the top surface of the absorption structure 138. The first doped region 135 may comprise the first doping type (e.g., p-type) and the second doped region 136 may comprise the second doping type (e.g., n-type). The one or more second light sensors 137 are configured to absorb electromagnetic radiation within a second wavelength range (e.g., IR light, NIR light, SWIR light, etc.) different from the first wavelength range. Thus, the stacked IC structure comprises two or more light sensors that efficiently absorb different wavelength ranges of electromagnetic radiation while increasing device density and reducing fabrication costs.

In some embodiments, the first and second doped regions 135, 136 are electrically coupled to one or more second pixel devices (not shown) and/or a control circuit (not shown) that is/are configured to selectively apply bias voltages to the first and/or second doped regions 135, 136. When appropriate bias voltages are applied to the first and/or second doped regions 135, 136, an electrical signal may be readout out that corresponds to photon generated charge carriers in the absorption structure 138. In various embodiments, the one or more second pixel devices (not shown) may be disposed within and/or on the second IC chip 104 (e.g., on the second substrate 108) and/or may be disposed on another IC chip (not shown).

A plurality of light filters 142 are disposed on a back-side surface 106b of the first substrate 106. The light filters 142 are configured to transmit specific wavelengths of electromagnetic radiation to the first and second light sensors 129, 137. In some embodiments, the light filters 142 comprise one or more of a band pass filter, a red color filter, a blue color filter, a green color filter, etc. In yet further embodiments, while each light filter 142 may be configured to pass at least one color of light, the light filters 142 may also be configured to pass light within the second wavelength range. An upper light guide structure 145 is disposed on the plurality of light filters 142 and is configured to direct electromagnetic radiation towards the first and second light sensors 129, 137. In some embodiments, the upper light guide structure 145 comprises a plurality of micro-lenses 144 that each have a convex upper surface.

A plurality of light guide regions 146 are disposed in the first and second interconnect structures 110, 112 and the first and second bond structures 114, 116. The light guide regions 146 continuously extend from the plurality of first light sensors 129 to a corresponding second light sensor 137. In some embodiments, a plurality of light guide structures 302 are disposed within the plurality of light guide regions 146. The plurality of light guide structures 302 respectively comprise a first light guide element 304 disposed in the first IC chip 102 and a second light guide element 306 disposed in the second IC chip 104. In various embodiments, the first and second light guide elements 304, 306 meet at a dielectric-to-dielectric bond. The first and second light guide elements 304, 306 may, for example, respectively be or comprise a high-k dielectric material, titanium oxide (e.g., $TiO_2$), tantalum oxide (e.g., $Ta_2O_5$), zirconium oxide (e.g., $ZrO_2$), some other suitable dielectric material, or any combination of the foregoing. As used herein a high-k dielectric material is a dielectric material with a dielectric constant greater than about 3.9. The light guide structures 302 may be configured as light pipe structures. A refractive index of the light guide structures 302 is greater than that of the dielectric bond structures 124 of the first and second bond structures 114, 116 and the interconnect dielectric structure 118 of the first and second interconnect structures 110, 112. Thus, the light guide structures 302 are configured to guide electromagnetic radiation to the one or more second light sensors 137 by total internal reflection (TIR), thereby increasing a quantum efficiency (QE) of the stacked IC structure. In various embodiments, electromagnetic radiation within the first wavelength range may be absorbed by the first light sensors 129 and electromagnetic radiation within the second wavelength range may pass through the first substrate 106 and the light guide structures 302 to the one or more second light sensors 137.

FIG. 3B illustrates a cross-sectional view 300b corresponding to some other embodiments of the stacked IC structure of FIG. 3A, where the absorption structure 138 is disposed along the front-side surface 108f of the second substrate 108. In some embodiments, a bottom surface of the absorption structure 138 directly contacts the front-side surface 108f of the second substrate 108. A dielectric layer 308 is disposed on the front-side surface 108f of the second substrate 108 and laterally wraps around the absorption structure 138. Further, the capping layer 140 is disposed on a top surface of the absorption structure 138. In some embodiments, a top surface of the capping layer 140 is coplanar with a top surface of the dielectric layer 308.

FIG. 3C illustrates a cross-sectional view 300c corresponding to some alternative embodiments of the stacked IC structure of FIG. 3B, where the plurality of light guide structures (302 of FIG. 3B) are omitted.

FIG. 3D illustrates a cross-sectional view 300d corresponding to some other embodiments of the stacked IC structure of FIG. 3A, where an individual second light sensor 137 directly underlies each first light sensor 129.

Figure 4A:
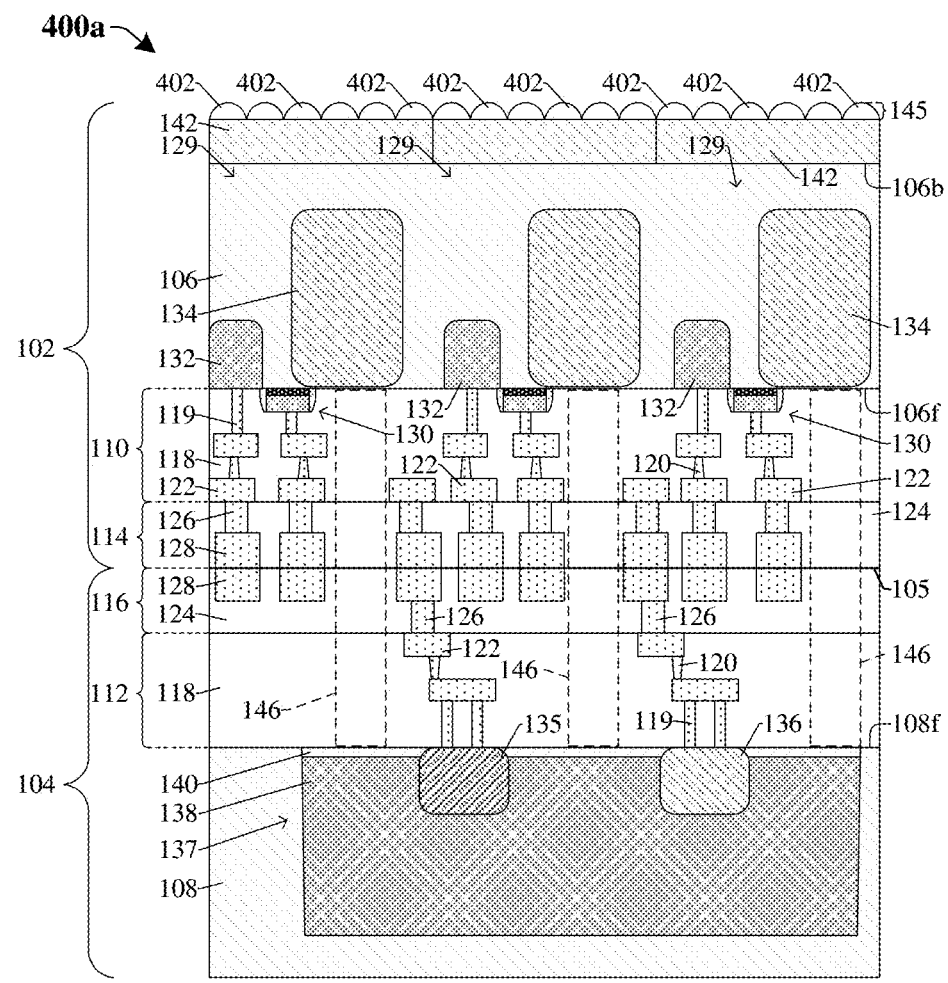
FIGS. 4A and 4B illustrate cross-sectional views of some other embodiments of the stacked IC structure of FIG. 1.

FIG. 4A illustrates a cross-sectional view 400a corresponding to some other embodiments of the stacked IC structure of FIG. 1, where the upper light guide structure 145 comprises a plurality of meta-lenses 402 configured to direct electromagnetic radiation towards the first and second light sensors 129, 137. In various embodiments, two or more meta-lenses 402 directly overlie each light filter 142.

Figure 4B:
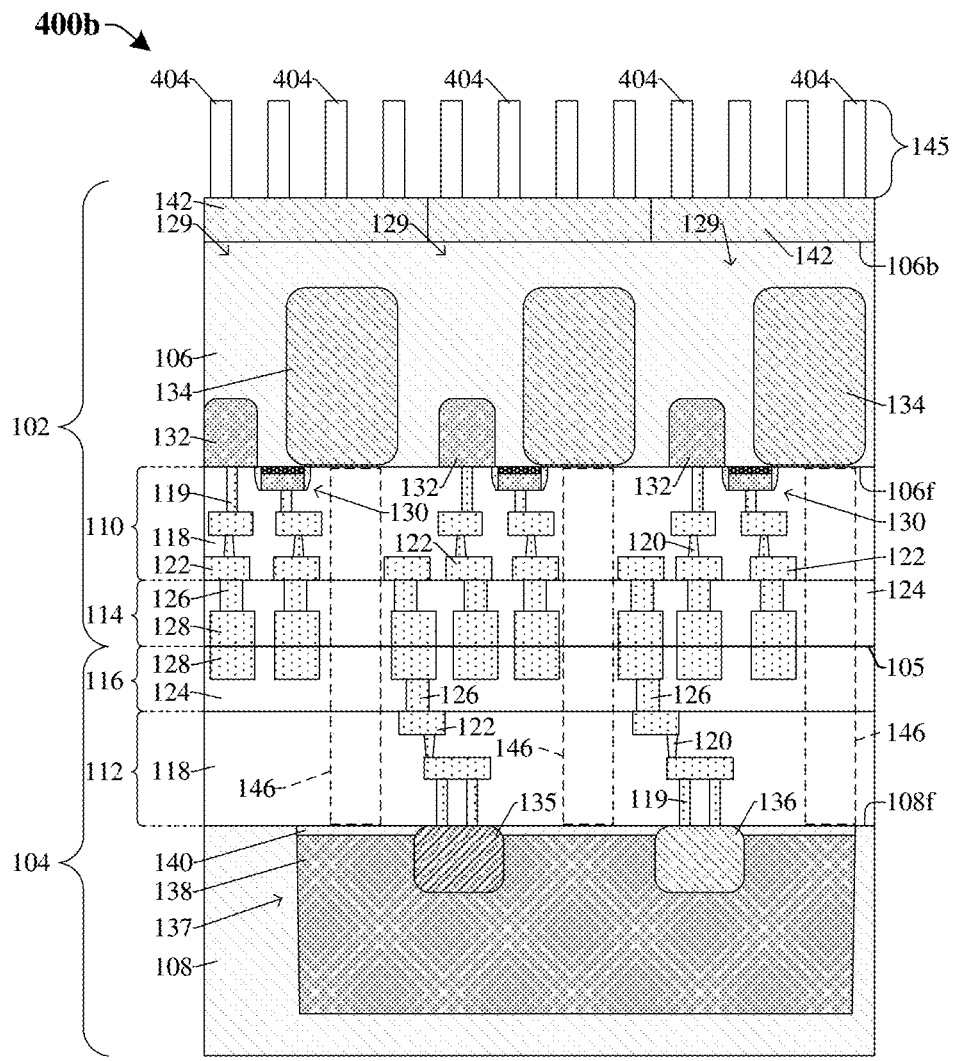

FIG. 4B illustrates a cross-sectional view 400b corresponding to some alternative embodiments of the stacked IC structure of FIG. 1, where the upper light guide structure 145 comprises a plurality of optical input structures 404. In various embodiments, the optical input structures 404 may, for example, be or comprise optical fibers, optical fiber structures, or the like. In some embodiments, the optical input structures 404 may be configured to direct electromagnetic radiation from an optical source (e.g., a laser) towards the first and second light sensors 129, 137.

FIGS. 5-17 illustrate various cross-sectional views 500-1700 of some embodiments of a method of forming a stacked IC structure comprising a first light sensor over a second light sensor, where the first and second light sensors are configured to absorb different wavelength ranges of electromagnetic radiation. The stacked IC structure may, for example, correspond to the stacked IC structure of FIG. 1. Although the cross-sectional views 500-1700 shown in FIGS. 5-17 are described with reference to the method, it will be appreciated that the structures shown in FIGS. 5-17 are not limited to the method but rather may stand alone separate of the method. Furthermore, although FIGS. 5-17 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 5:
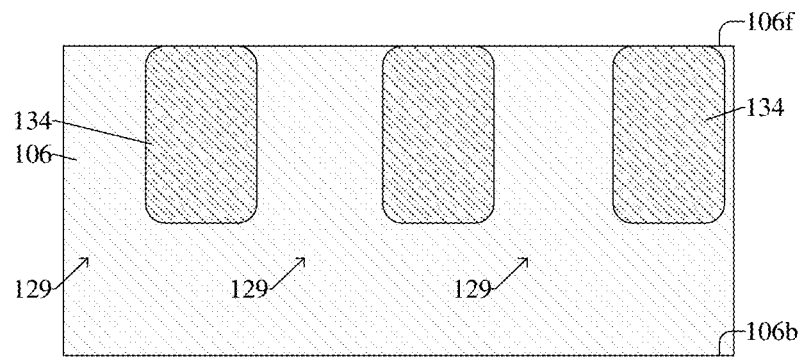
FIGS. 5-17 illustrate various cross-sectional views of some embodiments of a method of forming a stacked IC structure comprising a first light sensor over a second light sensor, where the first and second light sensors are configured to absorb different wavelength ranges of electromagnetic radiation.

As shown in cross-sectional view 500 of FIG. 5, a plurality of first light sensors 129 are formed within a first substrate 106 comprising a first semiconductor material (e.g., silicon), where the first light sensors 129 are configured to absorb electromagnetic radiation within a first wavelength range (e.g., visible light). In some embodiments, the first substrate 106 may, for example, be or comprise silicon, epitaxial silicon, bulk silicon, a silicon-on-insulator (SOI) substrate, one or more epitaxial layers, some other suitable substrate material, or the like. Further, the first substrate 106 may have a first doping type (e.g., p-type). In some embodiments, the first light sensors 129 respectively comprise a doped photodetector region 134 disposed in the first substrate 106. In various embodiments, a process for forming the first light sensors 129 includes forming an implant mask (not shown) over the first substrate 106 and implanting dopants into the first substrate 106 according to the implant mask. In some embodiments, the doped photodetector region 134 comprises one or more dopants (e.g., phosphorus, antimony, arsenic, or the like) having a second doping type (e.g., n-type) opposite the first doping type.

Figure 6:
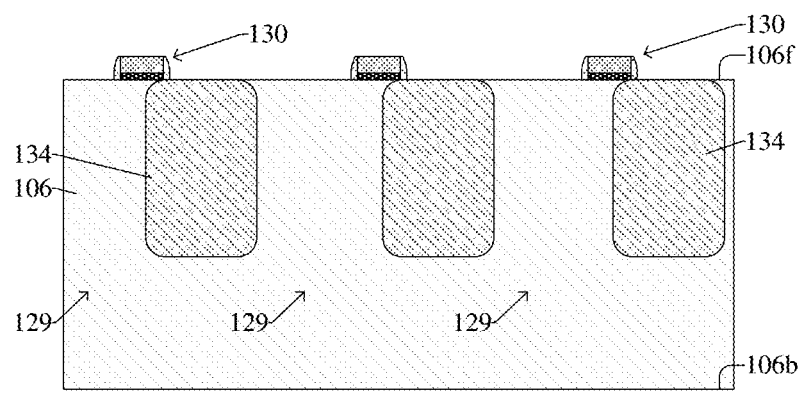

As shown in cross-sectional view 600 of FIG. 6, a plurality of pixel devices 130 are formed on a front-side surface 106f of the first substrate 106. In some embodiments, a process for forming the plurality of pixel devices 130 includes: depositing (e.g., by physical vapor deposition (PVD), chemical vapor deposition (CVD), atomic layer deposition (ALD), or the like) a gate dielectric on the first substrate 106; depositing (e.g., by PVD, CVD, sputtering, electroplating, electroless plating, etc.) a gate electrode on the gate dielectric; patterning the gate dielectric and the gate electrode; and forming a sidewall spacer around the gate electrode and the gate dielectric. In various embodiments, forming the pixel devices 130 may further comprise performing a selective ion implantation process to form one or more source/drain regions in the first substrate 106 (not shown). The gate electrode may, for example, be or comprise polysilicon, a metal material, another conductive material, or any combination of the foregoing. The gate dielectric may, for example, be or comprise silicon dioxide, a high-k dielectric material, some other dielectric material, or any combination of the foregoing.

Figure 7:
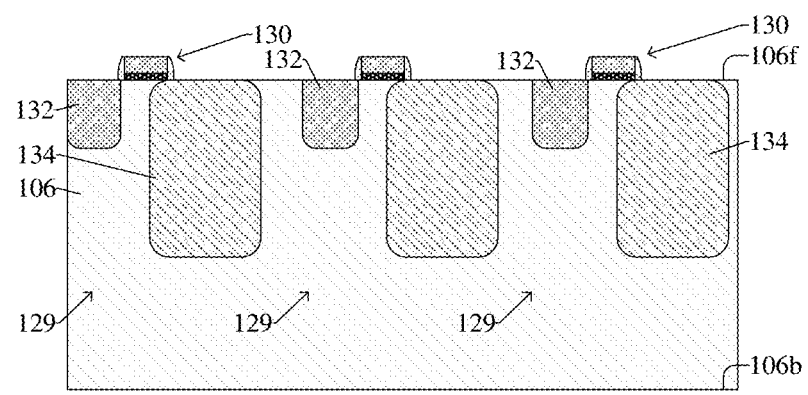

As shown in cross-sectional view 700 of FIG. 7, a plurality of floating diffusion nodes 132 are formed in the first substrate 106. The floating diffusion nodes 132 are respectively adjacent to a corresponding doped photodetector region 134. In some embodiments, a process for forming the floating diffusion nodes 132 includes forming an implant mask (not shown) over the first substrate 106 and implanting dopants (e.g., phosphorus, antimony, arsenic, or the like) into the first substrate 106 according to the implant mask. In various embodiments, the floating diffusion nodes 132 comprise one or more dopants (e.g., phosphorus, antimony, arsenic, or the like) having the second doping type (e.g., n-type).

Figure 8:
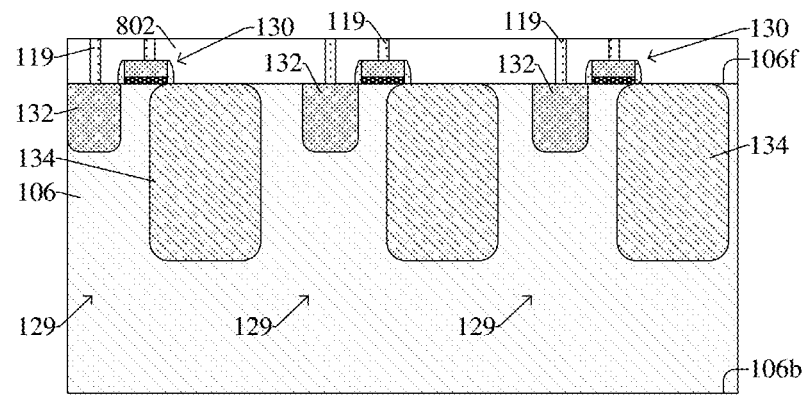

As shown in cross-sectional view 800 of FIG. 8, a dielectric layer 802 and a plurality of conductive contacts 119 are formed over the first substrate 106. The dielectric layer 802 may, for example, be formed over the first substrate 106 by CVD, PVD, ALD, or some other suitable growth or deposition process. In some embodiments, the dielectric layer 802 comprises silicon dioxide, a low-k dielectric material, or the like. In various embodiments, a process for forming the plurality of conductive contacts 119 includes: patterning the dielectric layer 802 to form a plurality of contact openings in the dielectric layer 802; depositing (e.g., by CVD, PVD, electroplating, etc.) a conductive material in the contact openings; and performing a planarization process (e.g., a chemical mechanical planarization (CMP) process) on the conductive material.

Figure 9:
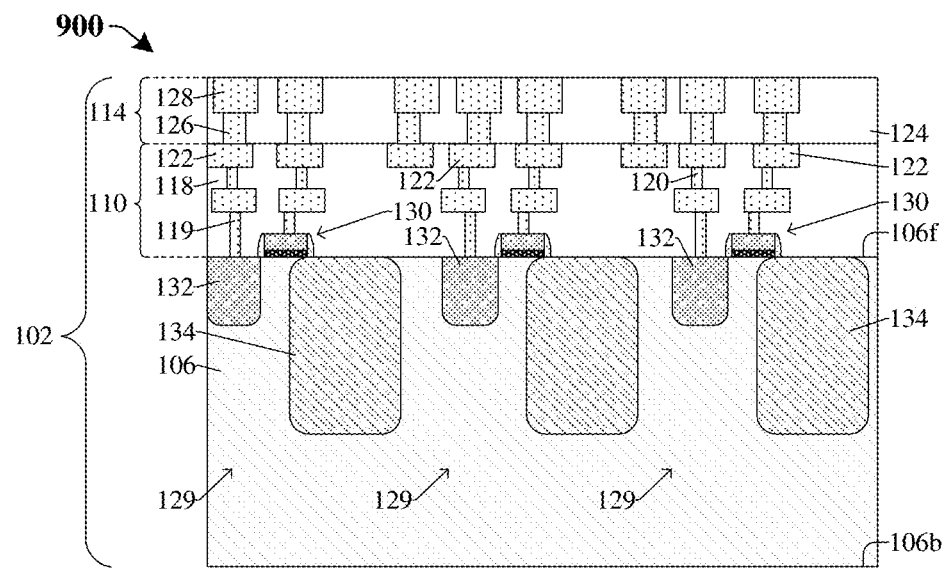

As shown in cross-sectional view 900 of FIG. 9, a first interconnect structure 110 is formed over the first substrate 106 and a first bond structure 114 is formed on the first interconnect structure 110, thereby defining a first IC chip 102. The first interconnect structure 110 comprises conductive vias 120 and conductive wires 122 disposed within an interconnect dielectric structure 118. In some embodiments, a process for forming one or more layers of conductive structures of the first interconnect structure 110 includes: depositing (e.g., by CVD, PVD, ALD, etc.) a dielectric layer over the first substrate 106; etching the dielectric layer to form conductive feature openings within the dielectric layer; depositing (e.g., by CVD, PVD, electroplating, etc.) a conductive material in the conductive feature openings; and performing a planarization process (e.g., a CMP process) on the conductive material.

Further, the first bond structure 114 comprises a plurality of bond contacts 126 and a plurality of bond pads 128 disposed within a dielectric bond structure 124. The plurality of bond contacts and pads 126, 128 are electrically coupled to the first interconnect structure 110. In some embodiments, a process for forming the bond contacts 126 includes: depositing (e.g., by CVD, PVD, ALD, etc.) a dielectric layer over the first interconnect structure 110; etching the dielectric layer to form contact openings; depositing a conductive material in the contact openings; and performing a planarization process (e.g., a CMP process) on the conductive material. In further embodiments, a process for forming the bond pads 128 includes: depositing (e.g., by CVD, PVD, ALD, etc.) another dielectric layer over the bond contacts 126; etching the another dielectric layer to form bond pad openings; depositing a conductive material in the bond pad openings; and performing a planarization process (e.g., a CMP process) on the conductive material.

Figure 10:
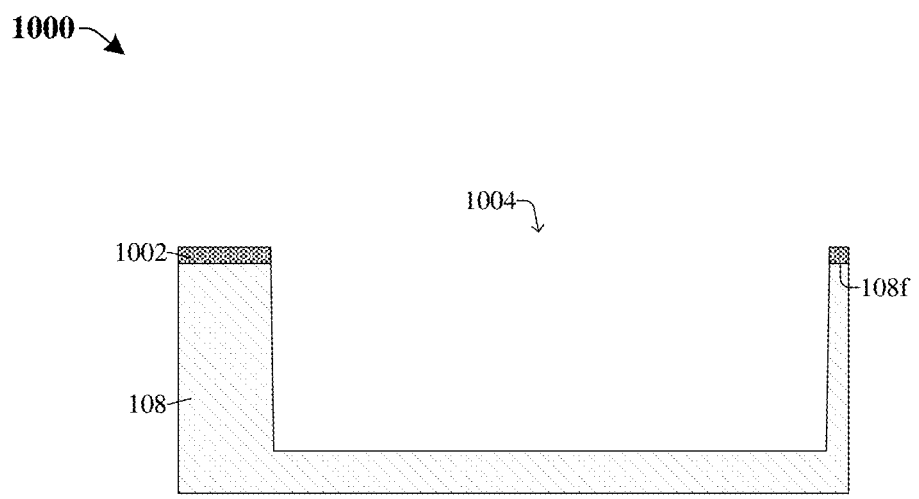

As shown in cross-sectional view 1000 of FIG. 10, a second substrate 108 is provided and a patterning process is performed on the second substrate 108 to form a recess 1004 extending into a front-side surface 108*f* of the second substrate 108. In some embodiments, the second substrate 108 may, for example, be or comprise silicon, epitaxial silicon, bulk silicon, an SOI substrate, one or more epitaxial layers, some other suitable substrate material, or the like. In various embodiments, the second substrate 108 comprises the first semiconductor material (e.g., silicon). The recess 1004 is defined by one or more surfaces of the second substrate 108. In some embodiments, patterning the second substrate 108 to form the recess 1004 includes forming a masking layer 1002 over the second substrate 108 and exposing the second substrate 108 to one or more etchants according to the masking layer 1002. The masking layer 1002 may be removed during and/or after the patterning process. In various embodiments, the patterning process includes performing a dry etch (e.g., a reactive ion etch, a plasma etch, etc.), a wet etch process, or any combination of the foregoing.

Figure 11:
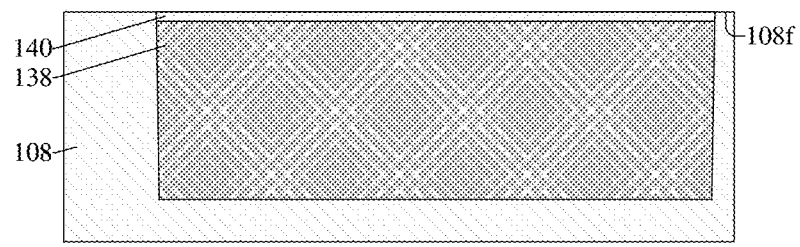

As shown in cross-sectional view 1100 of FIG. 11, an absorption structure 138 is formed in the second substrate 108 and a capping layer 140 is formed over the absorption structure 138. In some embodiments, the absorption structure 138 is formed along the one or more surfaces of the second substrate 108 that define the recess (1004 of FIG. 10). The absorption structure 138 comprises a second semiconductor material (e.g., germanium) different from the first semiconductor material (e.g., silicon). In various embodiments, the absorption structure 138 has the first doping type (e.g., p-type). In some embodiments, a process for forming the absorption structure 138 includes depositing (e.g., by CVD, PVD, an epitaxial growth process such as molecular-beam epitaxy (MBE), vapor-phase epitaxy (VPE), liquid-phase epitaxy (LPE), etc.) the second semiconductor material (e.g., germanium) within the recess (1004 of FIG. 10) and performing a removal process (e.g., an etch back process, a CMP process, etc.) on the second semiconductor material to remove excess material of the absorption structure 138 from above the second substrate 108. In various embodiments, a top surface of the absorption structure 138 is recessed below the second substrate 108. In some embodiments, the capping layer 140 is formed over the absorption structure 138 by CVD, PVD, MBE, VPE, LPE, or some other suitable growth or deposition process. Further, a planarization process (e.g., a CMP process) may be performed on the capping layer 140. In various embodiments, a top surface of the capping layer 140 is coplanar with the front-side surface 108*f* of the second substrate 108. The capping layer 140 may, for example, be or comprise silicon, epitaxial silicon, some other suitable semiconductor material, or the like.

Figure 12:
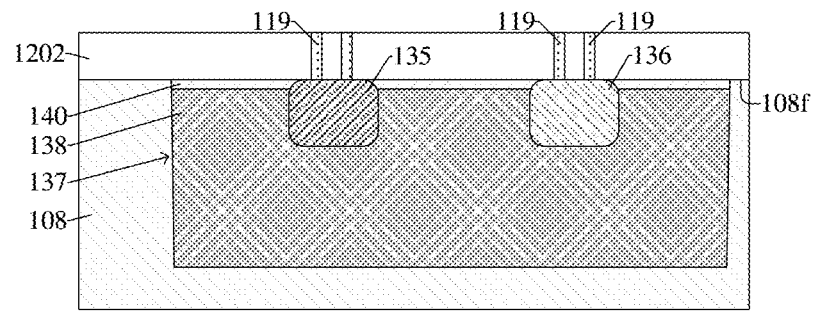

As shown in cross-sectional view 1200 of FIG. 12, first and second doped regions 135, 136 are formed in the absorption structure 138 thereby forming one or more second light sensors 137. The one or more second light sensors 137 are configured to absorb electromagnetic radiation within a second wavelength range (e.g., IR light, NIR light, SWIR light, etc.) different from the first wavelength range. Further, a dielectric layer 1202 and a plurality of conductive contacts 119 are formed over the second substrate 108.

In some embodiments, the first doped region 135 is formed by a first implantation process that includes forming a first implant mask (not shown) over the second substrate 108 and implanting dopants into the absorption structure 138 and/or the capping layer 140 according to the first implant mask. In various embodiments, the first doped region 135 comprises one or more dopants (e.g., boron, gallium, aluminum, or the like) having the first doping type (e.g., p-type). In further embodiments, the first doped region 135 has a higher doping concentration than regions of the absorption structure 138 abutting the first doped region 135. In further embodiments, the second doped region 136 is formed by a second implantation process that includes forming a second implant mask (not shown) over the second substrate 108 and implanting dopants into the absorption structure and/or the capping layer 140 according to the second implant mask. In some embodiments, the second doped region 136 comprises one or more dopants (e.g., phosphorus, antimony, arsenic, or the like) having the second doping type (e.g., n-type).

The dielectric layer 1202 may, for example, be formed over the second substrate 108 by CVD, PVD, ALD, or some other suitable growth or deposition process. The dielectric layer 1202 may, for example, be or comprise silicon dioxide, a low-k dielectric material, or the like. In various embodiments, a process for forming the plurality of conductive contacts 119 includes: patterning the dielectric layer 1202 to form a plurality of contact openings in the dielectric layer 1202; depositing (e.g., by CVD, PVD, electroplating, etc.) a conductive material in the contact openings; and performing a planarization process (e.g., a CMP process) on the conductive material.

Figure 13:
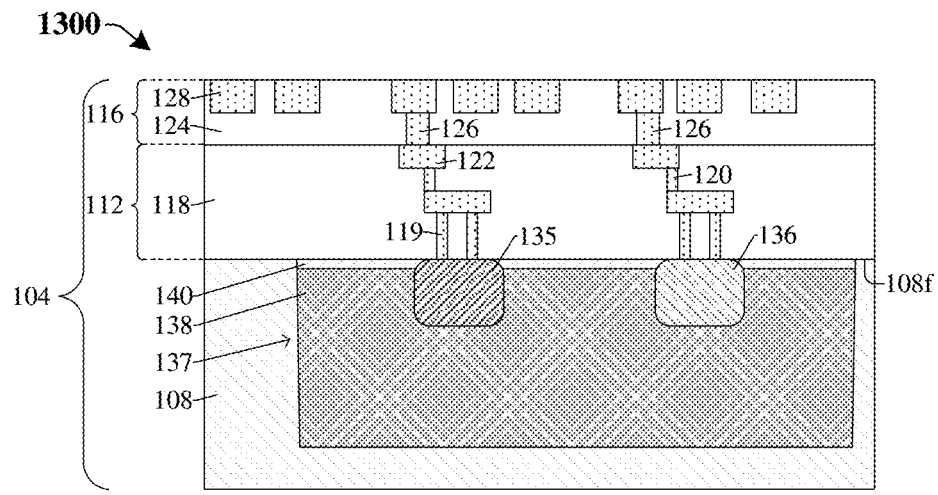

As shown in cross-sectional view 1300 of FIG. 13, a second interconnect structure 112 is formed over the second substrate 108 and a second bond structure 116 is formed on the second interconnect structure 112, thereby defining a second IC chip 104. The second interconnect structure 112 comprises conductive vias 120 and conductive wires 122 disposed within an interconnect dielectric structure 118. The second bond structure 116 comprises bond contacts 126 and bond pads 128 disposed within a dielectric bond structure 124. The second interconnect structure 112 and the second bond structure 116 may be formed by one or more deposition processes, one or more patterning processes, one or more planarization processes, some other suitable fabrication processes, or any combination of the foregoing. In some embodiments, the second interconnect structure 112 and the second bond structure 116 may be formed as the first interconnect structure (110 of FIG. 9) and the first bond structure (114 of FIG. 9) are formed as illustrated and/or described in FIG. 9.

Figure 14:
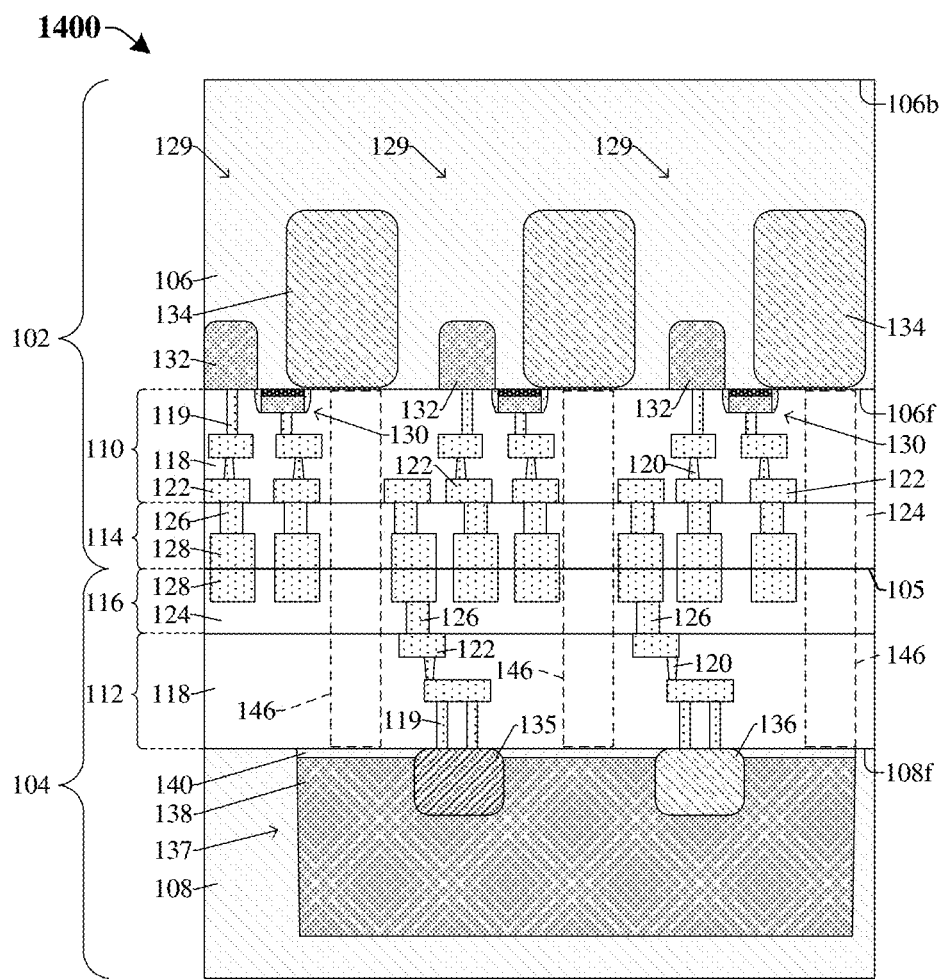

As shown in cross-sectional view 1400 of FIG. 14, the first IC chip 102 is flipped and subsequently bonded to the second IC chip 104 such that the first bond structure 114 and the second bond structure 116 meet at a bond interface 105. In some embodiments, the first IC chip 102 is bonded to the second IC chip 104 by a eutectic bond process, a fusion bond process, a metal-to-metal bond process, a dielectric-to-dielectric bond process, some other suitable bond process, or any combination of the foregoing. In various embodiments, bonding the first IC chip 102 to the second IC chip 104 includes: bringing dielectric bond structures 124 of the first and second bond structures 114, 116 in contact with one another and bringing bond pads 128 of the first and second bond structures 114, 116 in contact with one another; and applying pressure to the first and/or second IC chips 102, 104. In such embodiments, temperatures of the first and second bond structures 114, 116 may be increased to form the bond interface 105.

Figure 15:
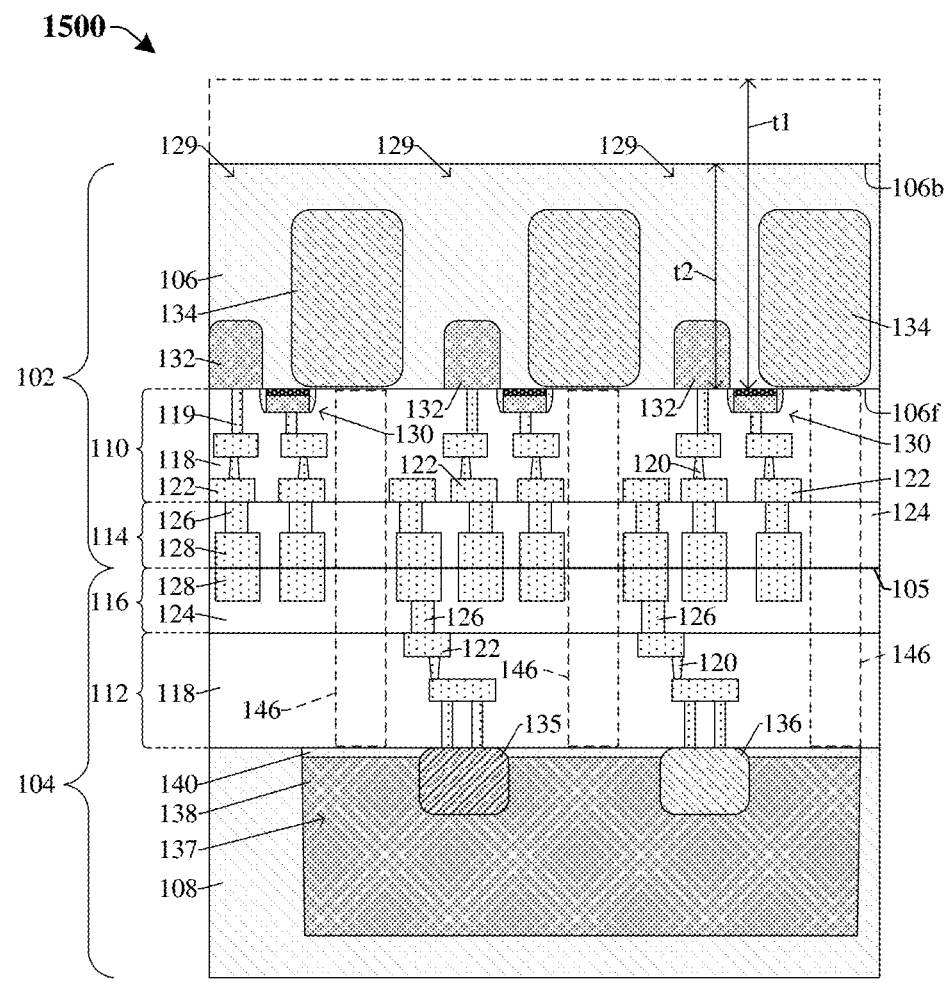

As shown in cross-sectional view 1500 of FIG. 15, a thinning process is performed on the first substrate 106. The thinning process includes reducing a first thickness t1 of the first substrate 106 to a second thickness t2. In some embodiments, the thinning process includes performing a CMP process, an etch process, a mechanical grinding process, some other thinning process, or any combination of the foregoing.

Figure 16:
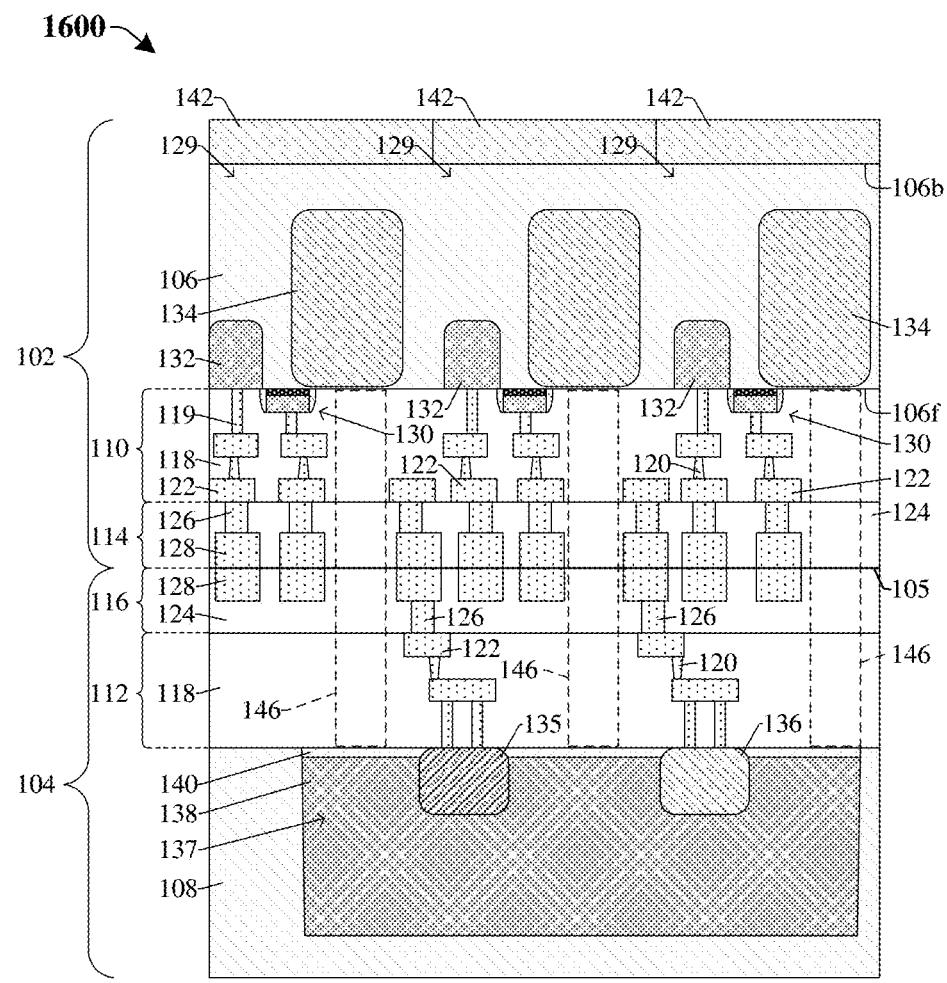

As shown in cross-sectional view 1600 of FIG. 16, a plurality of light filters 142 are formed on a back-side surface 106b of the first substrate 106. The light filters 142 may be formed by depositing (e.g., by CVD, PVD, ALD, etc.) and patterning respective color filter layers corresponding to the plurality of light filters 142.

Figure 17:
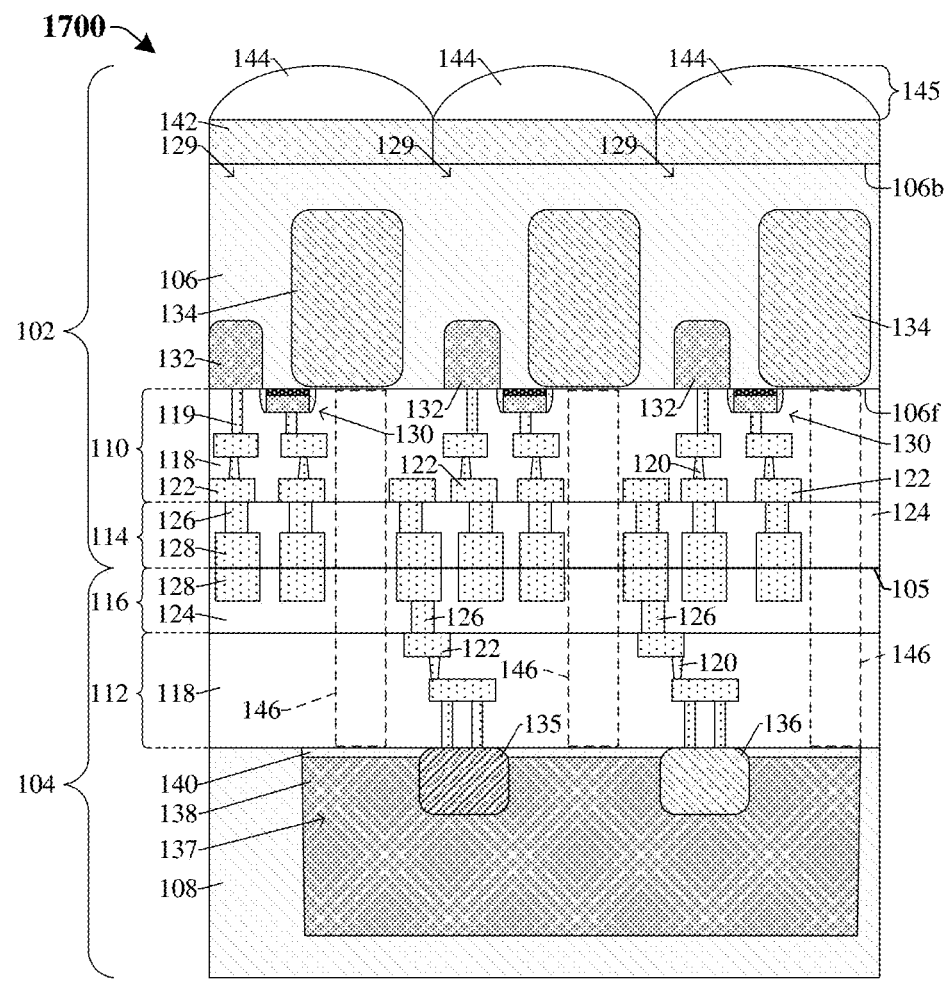

As shown in cross-sectional view 1700 of FIG. 17, an upper light guide structure 145 is formed over the plurality of light filters 142. In various embodiments, the upper light guide structure 145 comprises a plurality of micro-lenses 144. In such embodiments, the micro-lenses 144 may be formed by depositing (e.g., by CVD, PVD, ALD, etc.) a micro-lens material over the light filters 142 and patterning the micro-lens material to form the plurality of micro-lenses 144. In further embodiments, the upper light guide structure 145 may be configured as illustrated and/or described in FIGS. 4A and 4B.

FIGS. 18-24 illustrate various cross-sectional views 1800-2400 of some embodiments of a method of forming a stacked IC structure comprising a first light sensor over a second light sensor, where the first and second light sensors are configured to absorb different wavelength ranges of electromagnetic radiation. The stacked IC structure may, for example, correspond to the stacked IC structure of FIG. 3A. Although the cross-sectional views 1800-2400 shown in FIGS. 18-24 are described with reference to the method, it will be appreciated that the structures shown in FIGS. 18-24 are not limited to the method but rather may stand alone separate from the method. Furthermore, although FIGS. 18-24 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 18:
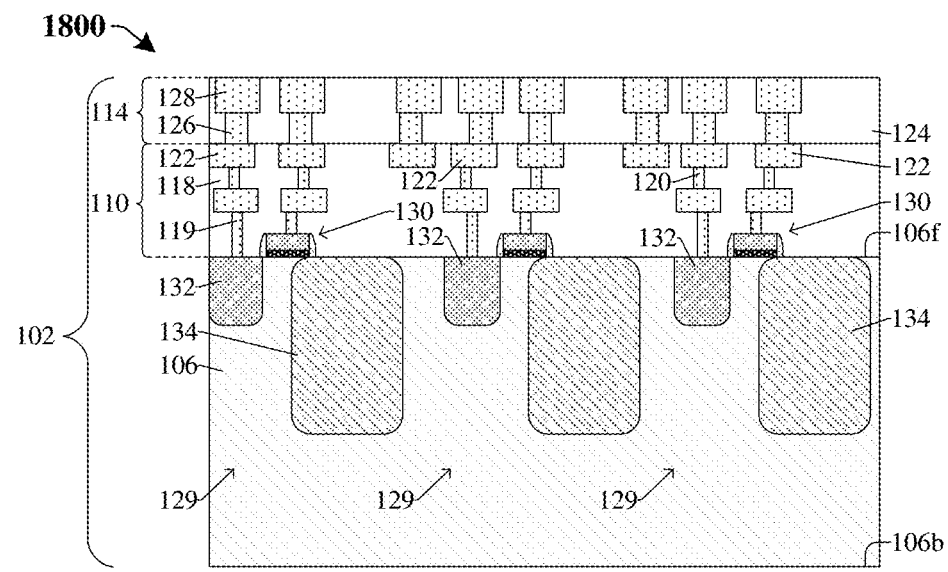
FIGS. 18-24 illustrate various cross-sectional views of some other embodiments of a method of forming a stacked IC structure comprising a first light sensor over a second light sensor, where the first and second light sensors are configured to absorb different wavelength ranges of electromagnetic radiation.

As shown in cross-sectional view 1800 of FIG. 18, a first substrate 106 is provided and a first IC chip 102 is formed on the first substrate 106. The first IC chip 102 comprises a plurality of first light sensors 129 configured to absorb electromagnetic radiation within a first wavelength range (e.g., visible light), a first interconnect structure 110 on the first substrate 106, and a first bond structure 114 on the first interconnect structure 110. In various embodiments, the first IC chip 102 is formed as illustrated and/or described in FIGS. 5-9.

Figure 19:
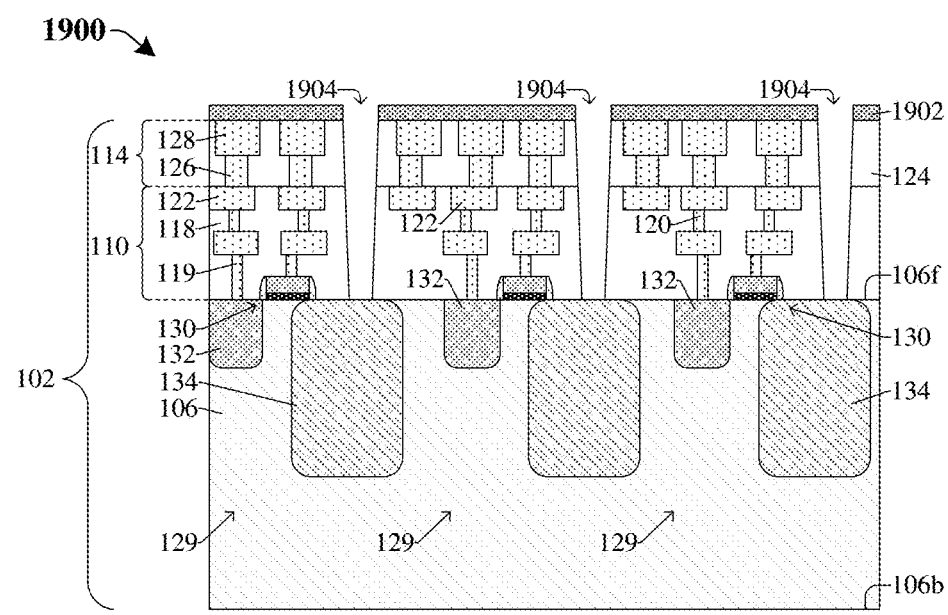

As shown in cross-sectional view 1900 of FIG. 19, a patterning process is performed on the first interconnect structure 110 and the first bond structure 114. In some embodiments, the patterning process includes forming a masking layer 1902 over the first bond structure 114 and exposing the dielectric bond structure 124 of the first bond structure 114 and the interconnect dielectric structure 118 of the first interconnect structure 110 to one or more etchants according to the masking layer 1902, thereby forming first light guide openings 1904. The masking layer 1902 may, for example, be removed during and/or after the patterning process. In various embodiments, the patterning process includes performing a reactive ion etch, a plasma etch, a wet etch, or the like. In yet further embodiments, the patterning process exposes regions of the front-side surface 106f of the first substrate 106.

Figure 20:
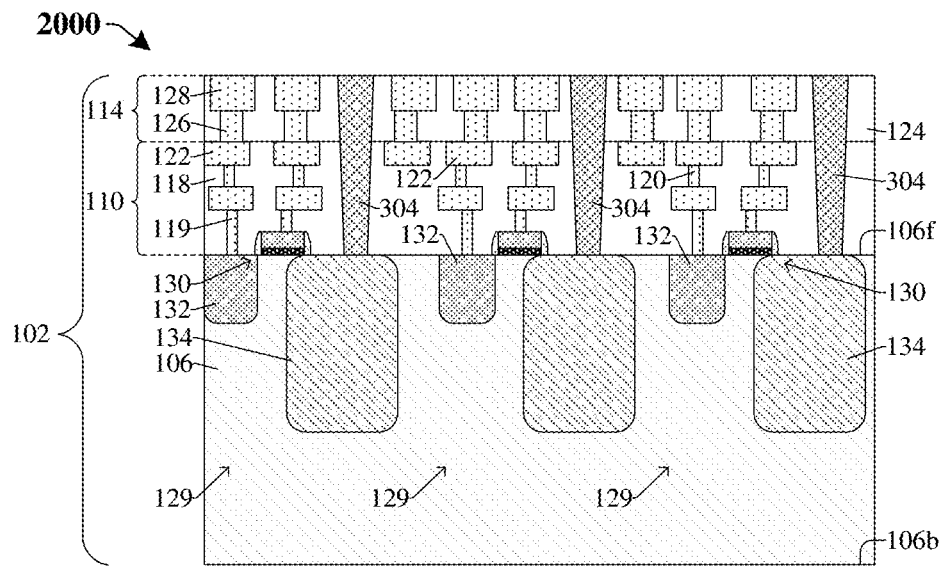

As shown in cross-sectional view 2000 of FIG. 20, a plurality of first light guide elements 304 are formed within the first interconnect structure 110 and the first bond structure 114. In various embodiments, a process for forming the plurality of first light guide elements 304 includes depositing (e.g., by ALD, PVD, CVD, etc.) a light guide material within the first light guide openings (1904 of FIG. 19) and performing a planarization process (e.g., a CMP process) on the light guide material. The first light guide elements 304 may, for example, be or comprise a high-k dielectric material (e.g., dielectric material having dielectric constant greater than 3.9), titanium oxide (e.g., $TiO_2$), tantalum oxide (e.g., $Ta_2O_5$), zirconium oxide (e.g., $ZrO_2$), some other suitable dielectric material, or any combination of the foregoing. In further embodiments, a refractive index of the first light guide elements 304 is greater than that of the dielectric bond structure 124 of the first bond structure 114 and the interconnect dielectric structure 118 of the first interconnect structure 110.

Figure 21:
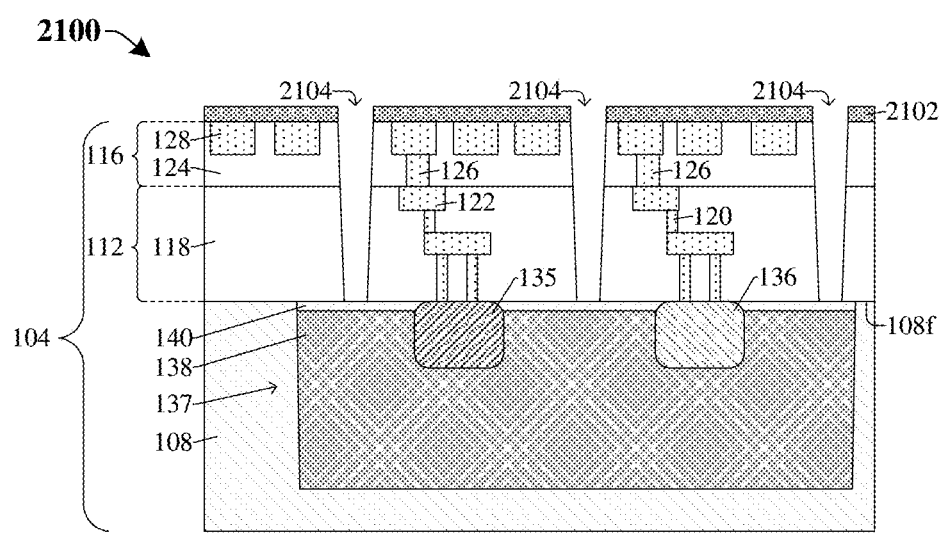

As shown in cross-sectional view 2100 of FIG. 21, a second substrate 108 is provided and a second IC chip 104 is formed on the second substrate 108. Further, a patterning process is performed on the second IC chip 104 to form a plurality of second light guide openings 2104 in the second IC chip 104. The second IC chip 104 comprises one or more second light sensors 137 configured to absorb electromagnetic radiation within a second wavelength range (e.g., IR light, NIR light, SWIR light, etc.), a second interconnect structure 112 on the second substrate 108, and a second bond structure 116 on the second interconnect structure 112. In various embodiments, the second IC chip 104 is formed as illustrated and/or described in FIGS. 10-13.

In various embodiments, the patterning process includes forming a masking layer 2102 over the second bond structure 116 and exposing the dielectric bond structure 124 of the second bond structure 116 and the interconnect dielectric structure 118 of the second interconnect structure 112 to one or more etchants according to the masking layer 2102, thereby forming the second light guide openings 2104. The masking layer 2102 may, for example, be removed during and/or after the patterning process. In some embodiments, the patterning process includes performing a reactive ion etch, a plasma etch, a wet etch, or the like. In further embodiments, the patterning process exposes regions of an upper surface of the capping layer 140 and/or regions of the front-side surface 108f of the second substrate 108.

Figure 22:
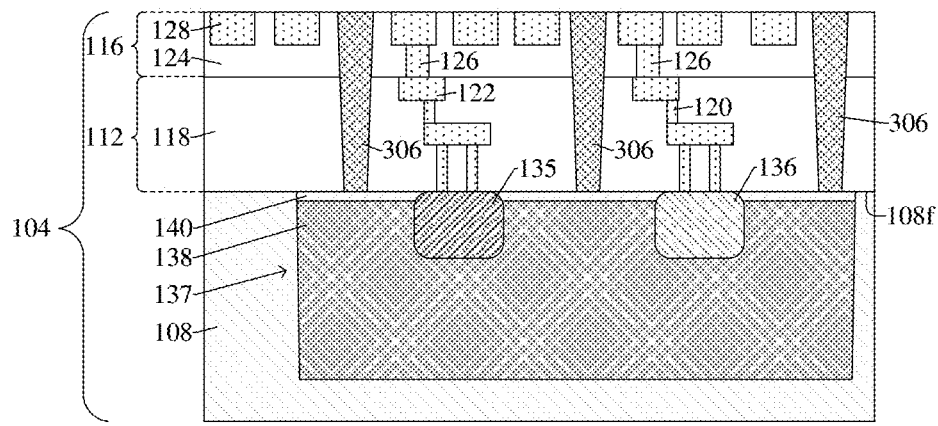

As shown in cross-sectional view 2200 of FIG. 22, a plurality of second light guide elements 306 are formed within the second interconnect structure 112 and the second bond structure 116. In some embodiments, a process for forming the plurality of second light guide elements 306 includes depositing (e.g., by ALD, PVD, CVD, etc.) a light guide material within the second light guide openings (2104 of FIG. 21) and performing a planarization process (e.g., a CMP process) on the light guide material. The second light guide elements 306 may, for example, be or comprise a high-k dielectric material, titanium oxide (e.g., $TiO_2$), tantalum oxide (e.g., $Ta_2O_5$), zirconium oxide (e.g., $ZrO_2$), some other suitable dielectric material, or any combination of the foregoing. In various embodiments, a refractive index of the second light guide elements 306 is greater than that of the dielectric bond structure 124 of the second bond structure 116 and the interconnect dielectric structure 118 of the second interconnect structure 112.

As shown in cross-sectional view 2300 of FIG. 23, the first IC chip 102 is flipped and subsequently bonded to the second IC chip 104 such that the first bond structure 114 and the second bond structure 116 meet at a bond interface 105. In some embodiments, the first IC chip 102 is bonded to the second IC chip 104 by a eutectic bond process, a fusion bond process, a metal-to-metal bond process, a dielectric-to-dielectric bond process, some other suitable bond process, or any combination of the foregoing. In further embodiments, bonding the first IC chip 102 to the second IC chip 104 forms a plurality of light guide structures 302 that respectively comprise a corresponding first light guide element 304 and a corresponding second light guide element 306. The plurality of first light guide elements 304 may directly contact the plurality of second light guide elements 306, where the first light guide elements 304 meet the second light guide elements 306 at a dielectric-to-dielectric bond interface.

Figure 23:
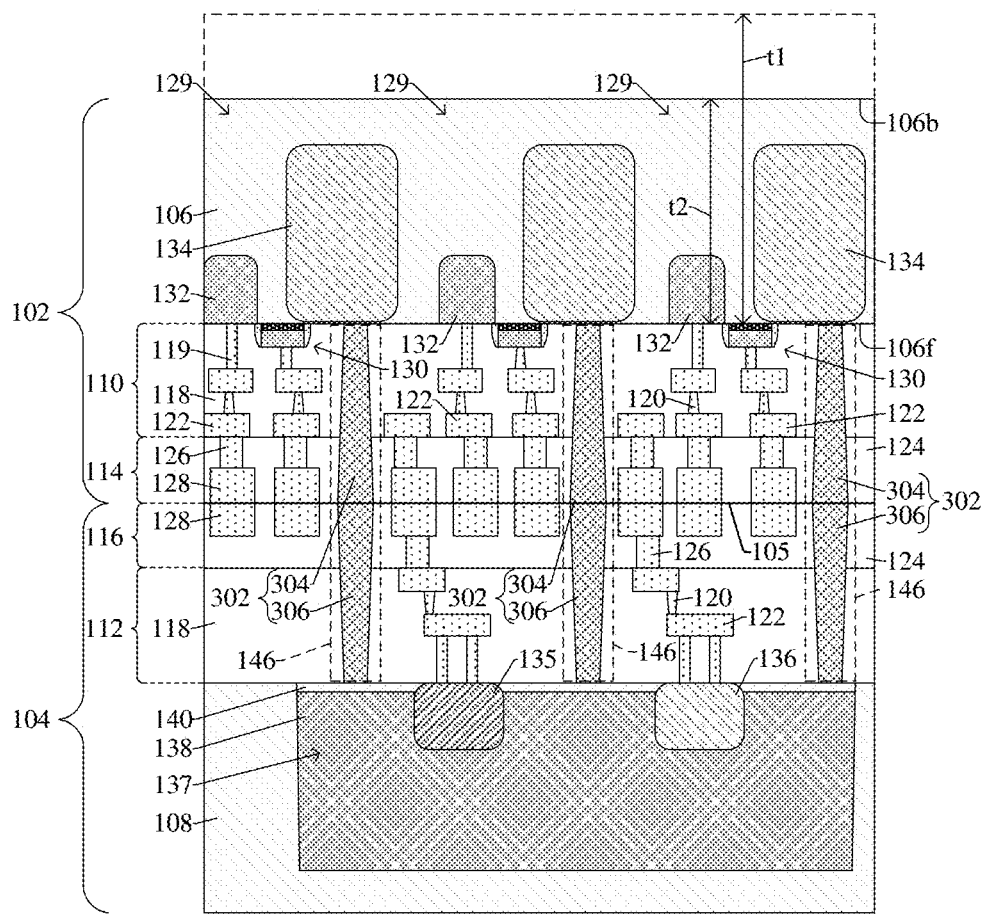

Further, as shown in the cross-sectional view 2300 of FIG. 23, a thinning process is performed on the first substrate 106 after bonding the first IC chip 102 to the second IC chip 104. The thinning process includes reducing a first thickness t1 of the first substrate 106 to a second thickness t2. In various embodiments, the thinning process comprises a mechanical grinding process, a CMP process, an etching process, or the like.

Figure 24:
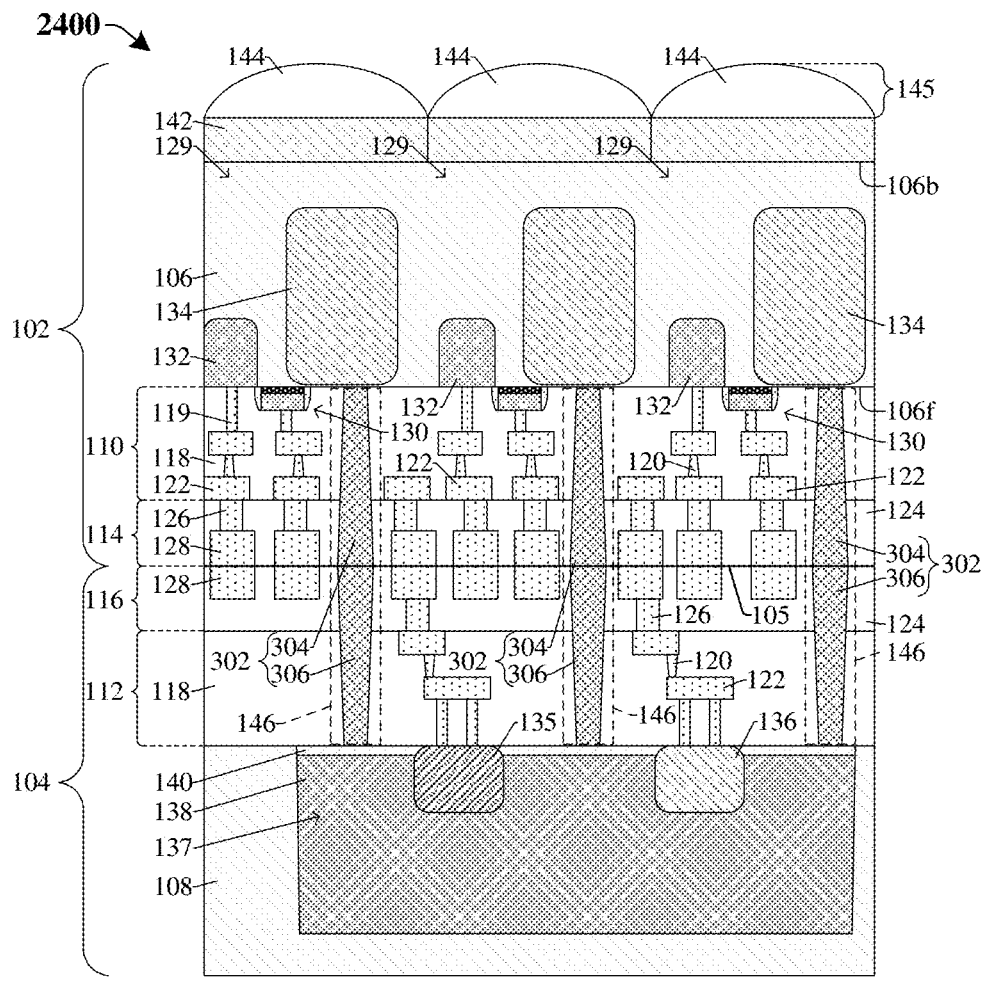

As shown in cross-sectional view 2400 of FIG. 24, a plurality of light filters 142 are formed on a back-side surface 106b of the first substrate 106. Further, an upper light guide structure 145 is formed on the plurality of light filters 142. In some embodiments, the upper light guide structure 145 comprises a plurality of micro-lenses 144.

FIGS. 25-30 illustrate various cross-sectional views 2500-3000 of some embodiments of a method of forming a stacked IC structure comprising a first light sensor over a second light sensor, where the first and second light sensors are configured to absorb different wavelength ranges of electromagnetic radiation. The stacked IC structure may, for example, correspond to the stacked IC structure of FIG. 3C. Although the cross-sectional views 2500-3000 shown in FIGS. 25-30 are described with reference to the method, it will be appreciated that the structures shown in FIGS. 25-30 are not limited to the method but rather may stand alone separate of the method. Furthermore, although FIGS. 25-30 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 25:
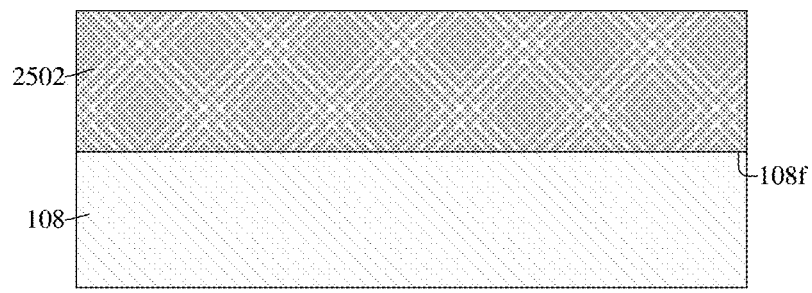
FIGS. 25-30 illustrate various cross-sectional views of further embodiments of a method of forming a stacked IC structure comprising a first light sensor over a second light sensor, where the first and second light sensors are configured to absorb different wavelength ranges of electromagnetic radiation.

As shown in cross-sectional view 2500 of FIG. 25, an absorption layer 2502 is formed on a front-side surface 108f of a second substrate 108. The absorption layer 2502 comprises the second semiconductor material (e.g., germanium). In various embodiments, the absorption layer 2502 is formed on the second substrate 108 by CVD, PVD, an epitaxial growth process such as MBE, VPE, LPE, or some other suitable growth or deposition process. In some embodiments, the absorption layer 2502 comprises the first doping type (e.g., p-type).

Figure 26:
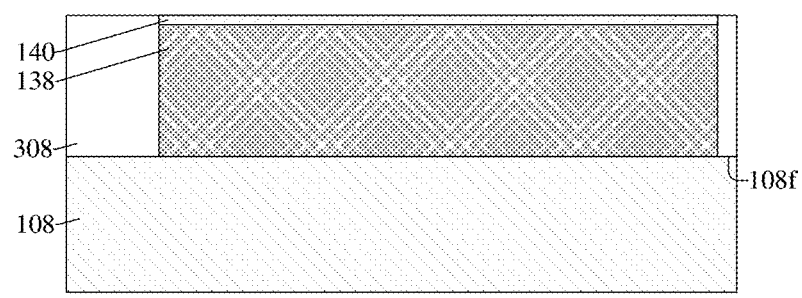

As shown in cross-sectional view 2600 of FIG. 26, a patterning process is performed on the absorption layer (2502 of FIG. 25) to remove portions of the absorption layer (2502 of FIG. 25) and form an absorption structure 138. Further, a capping layer 140 is formed over the absorption structure 138 and a dielectric layer 308 is formed over the second substrate 108. In some embodiments, the patterning process includes: forming a masking layer (not shown) over the absorption layer (2502 of FIG. 25) and exposing the absorption layer (2502 of FIG. 25) to one or more etchants according to the masking layer. The capping layer 140 may be formed over the absorption structure 138 by, for example, CVD, PVD, MBE, VPE, LPE, or some other suitable growth or deposition process. The dielectric layer 308 may be formed over the second substrate 108 by, for example, CVD, PVD, ALD, or some other suitable growth or deposition process.

Figure 27:
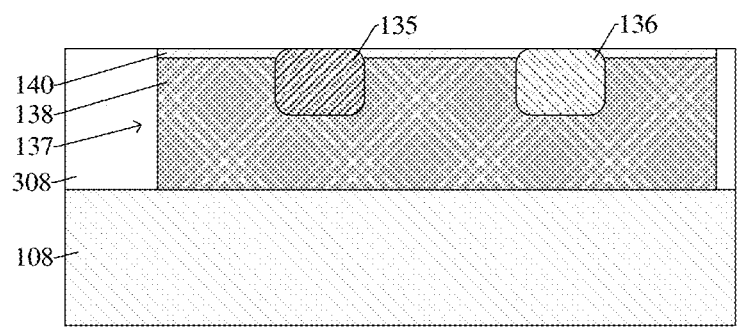

As shown in cross-sectional view 2700 of FIG. 27, first and second doped regions 135, 136 are formed in the absorption structure 138 thereby defining one or more second light sensors 137. The first and second doped regions 135, 136 may be formed as illustrated and/or described in FIG. 12.

Figure 28:
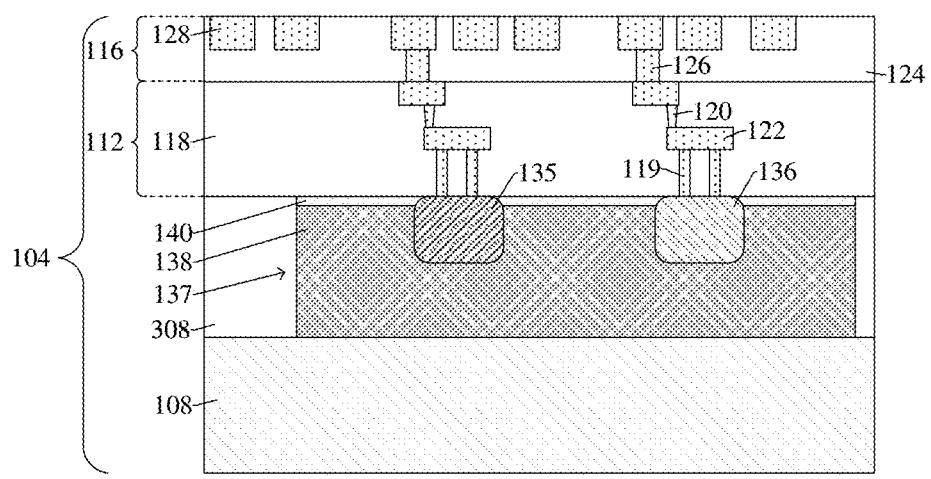

As shown in cross-sectional view 2800 of FIG. 28, a second interconnect structure 112 is formed over the absorption structure 138 and a second bond structure 116 is formed on the second interconnect structure 112, thereby defining a second IC chip 104. The second interconnect structure 112 and the second bond structure 116 may be formed as illustrated and/or described in FIGS. 12 and/or 13.

Figure 29:
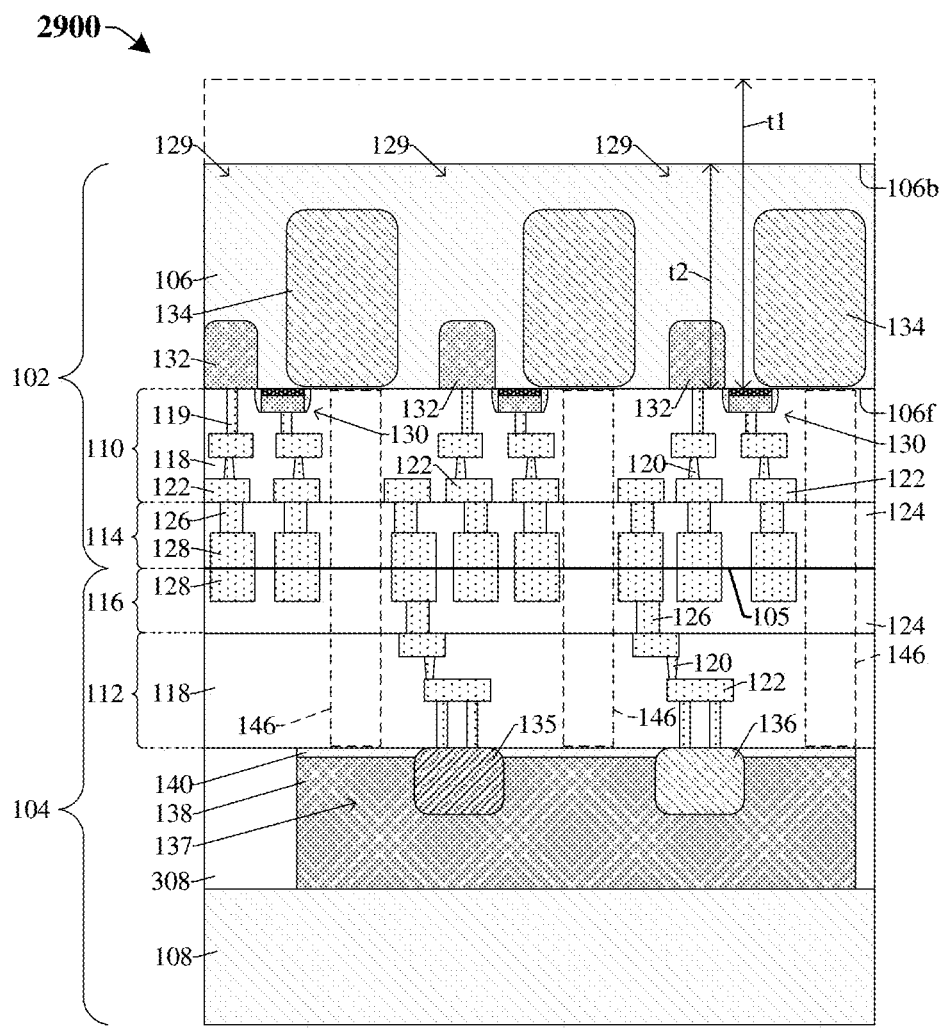

As shown in cross-sectional view 2900 of FIG. 29, a first IC chip 102 is provided and subsequently bonded to the second IC chip 104. The first IC chip 102 may be formed as illustrated and/or described in FIGS. 5-9. Further, a thinning process is performed to reduce a first thickness t1 of the first substrate 106 to a second thickness t2.

Figure 30:
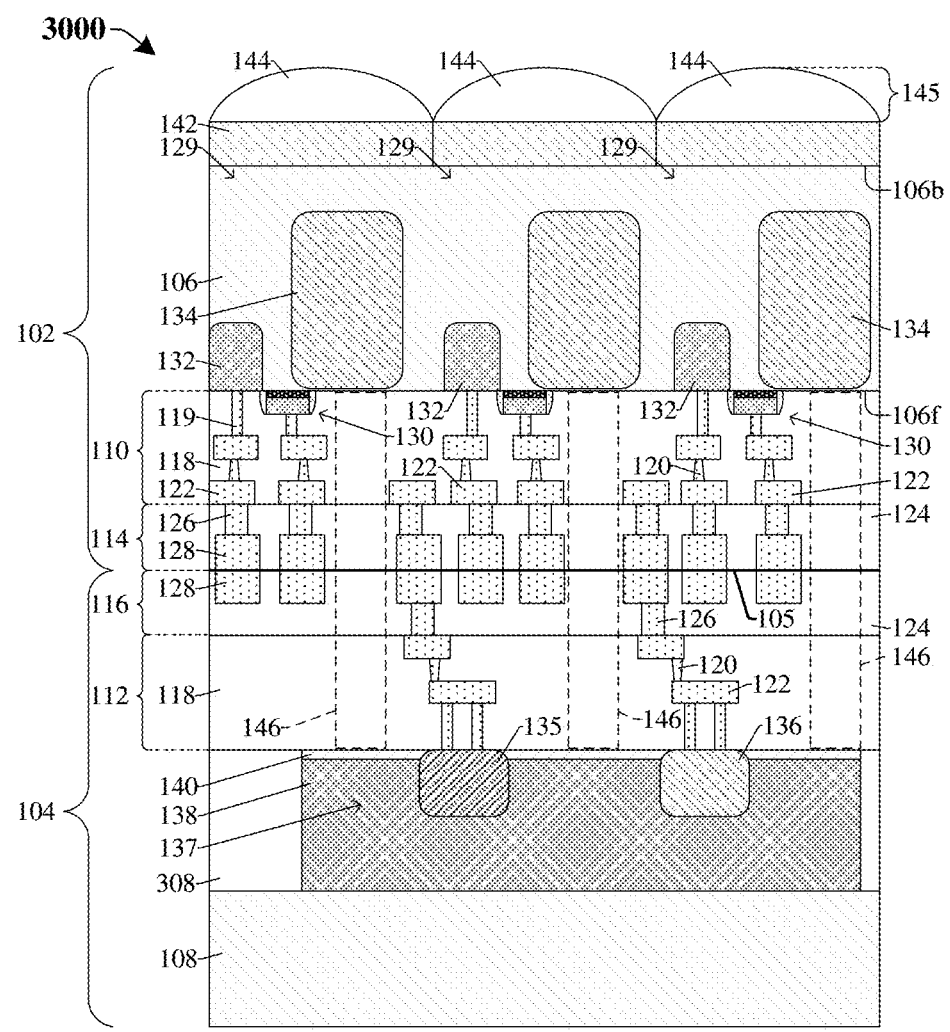

As shown in cross-sectional view 3000 of FIG. 30, a plurality of light filters 142 are formed on a back-side surface 106b of the first substrate 106. Further, an upper light guide structure 145 is formed on the plurality of light filters 142. In some embodiments, the upper light guide structure 145 comprises a plurality of micro-lenses 144.

FIGS. 31-35 illustrate various cross-sectional views 3100-3500 of some embodiments of a method of forming a stacked IC structure comprising a first light sensor over a second light sensor, where the first and second light sensors are configured to absorb different wavelength ranges of electromagnetic radiation. The stacked IC structure may, for example, correspond to the stacked IC structure of FIG. 3B.

Although the cross-sectional views 3100-3500 shown in FIGS. 31-35 are described with reference to the method, it will be appreciated that the structures shown in FIGS. 31-35 are not limited to the method but rather may stand alone separate of the method. Furthermore, although FIGS. 31-35 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 31:
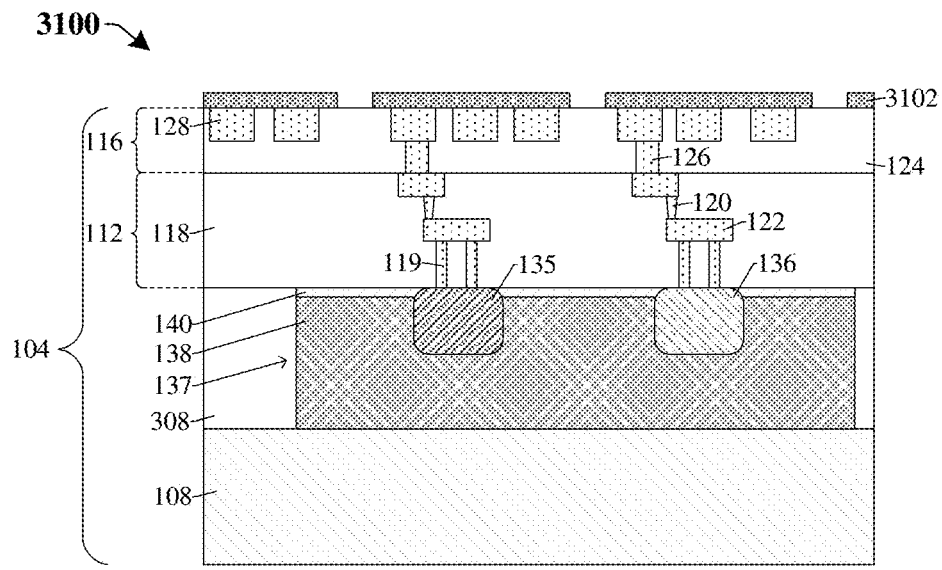
FIGS. 31-35 illustrate various cross-sectional views of yet further embodiments of a method of forming a stacked IC structure comprising a first light sensor over a second light sensor, where the first and second light sensors are configured to absorb different wavelength ranges of electromagnetic radiation.

As shown in cross-sectional view 3100 of FIG. 31, a second substrate 108 is provided and a second IC chip 104 is formed on the second substrate 108. The second IC chip 104 comprises one or more second light sensors 137 configured to absorb electromagnetic radiation within a second wavelength range (e.g., IR light, NIR light, SWIR light, etc.), a second interconnect structure 112 over the second substrate 108, and a second bond structure 116 on the second interconnect structure 112. Further, a masking layer 3102 is formed over second bond structure 116. In various embodiments, the second IC chip 104 is formed as illustrated and/or described in FIGS. 25-28.

Figure 32:
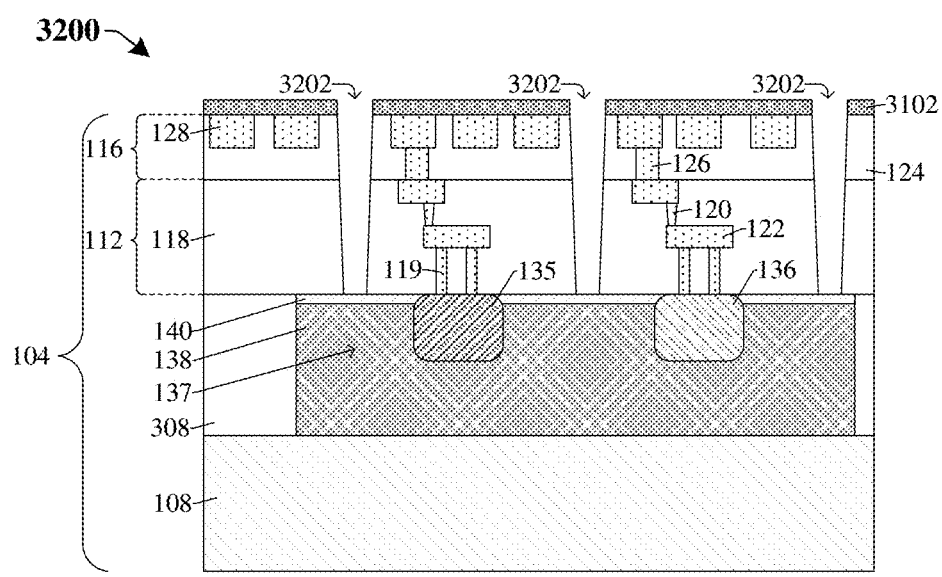

As shown in cross-sectional view 3200 of FIG. 32, an etching process is performed on the second IC chip 104 to formed a plurality of second light guide openings 3202. In various embodiments, the etching process is performed according to the masking layer 3102 and includes performing a reactive ion etch, a plasma etch, a wet etch, some other suitable etch, or the like. In some embodiments, the masking layer 3102 is removed during and/or after the etching process.

Figure 33:
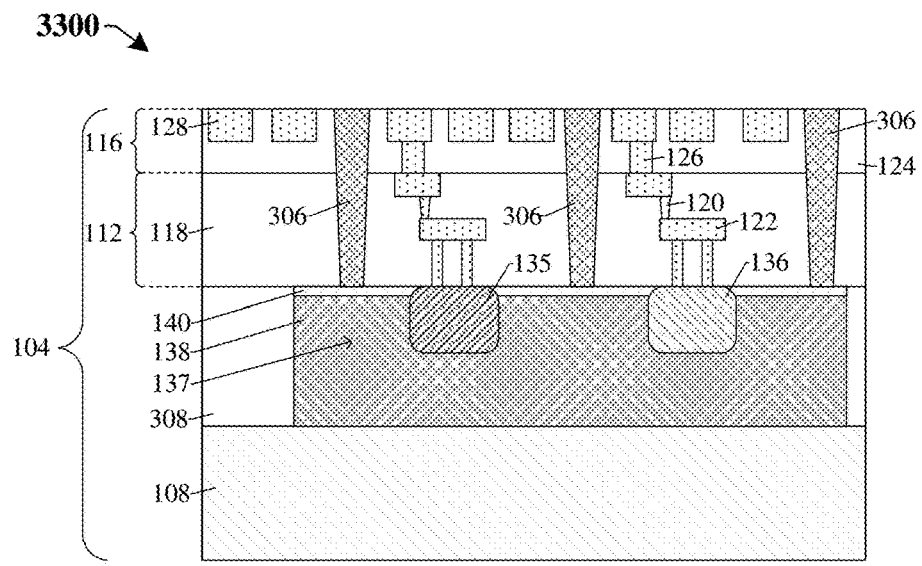

As shown in cross-sectional view 3300 of FIG. 33, a plurality of second light guide elements 306 are formed within the second interconnect structure 112 and the second bond structure 116. In some embodiments, a process for forming the plurality of second light guide elements 306 includes depositing (e.g., by ALD, PVD. CVD, etc.) a light guide material (e.g., a high-k dielectric material, titanium oxide, tantalum oxide, zirconium oxide, etc.) within the second light guide openings (3202 of FIG. 32) and performing a planarization process (e.g., a CMP process) on the light guide material.

Figure 34:
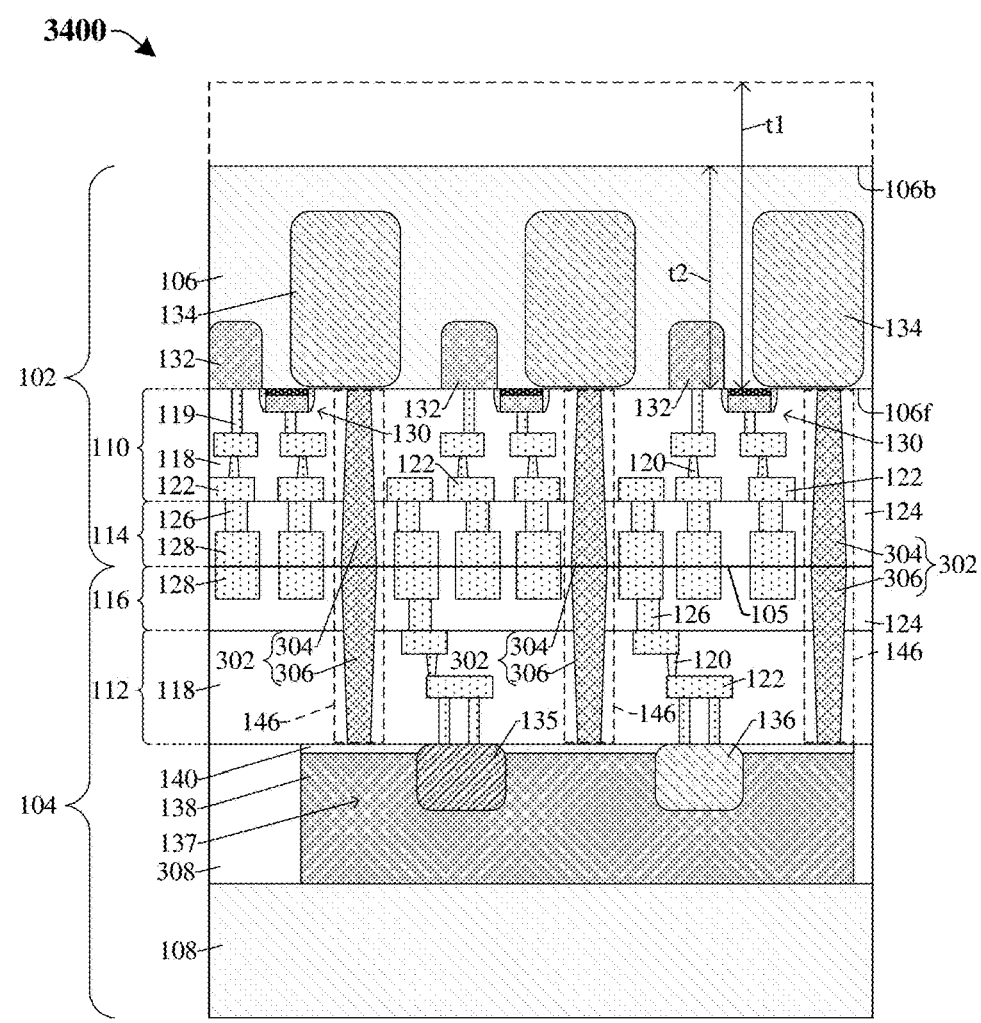

As shown in cross-sectional view 3400 of FIG. 34, a first IC chip 102 is provided and subsequently bonded to the second IC chip 104, such that the first and second bond structures meet at a bond interface 105. The first IC chip 102 may be formed as illustrated and/or described in FIGS. 18-20. In some embodiments, the first IC chip 102 is bonded to the second IC chip 104 by a eutectic bonding process, a fusion bonding process, a metal-to-metal bond process, a dielectric-to-dielectric bond process, some other suitable bond process, or any combination of the foregoing. Further, bonding the first IC chip 102 to the second IC chip 104 forms a plurality of light guide structures 302 that respectively comprise a corresponding first light guide element 304 and a corresponding second light guide element 306.

Figure 35:
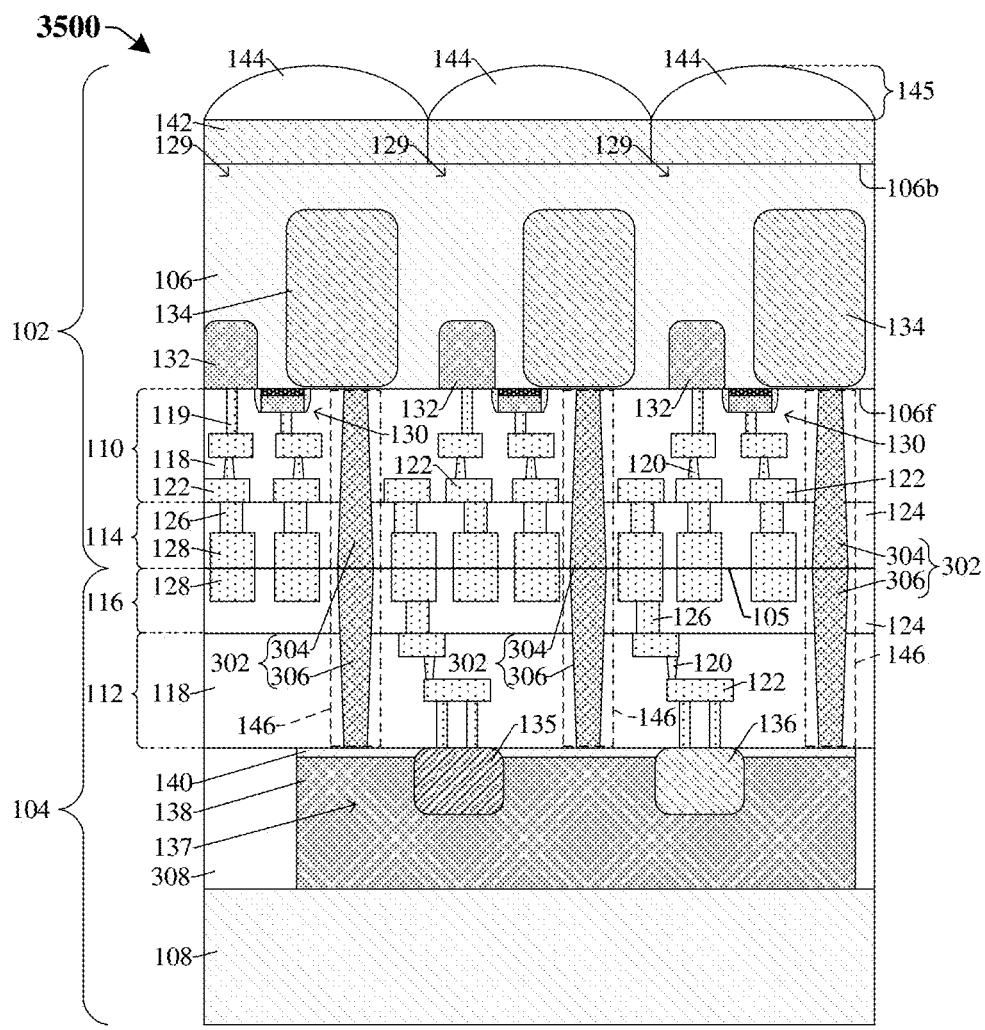

As shown in cross-sectional view 3500 of FIG. 35, a plurality of light filters 142 are formed on a back-side surface 106b of the first substrate 106 and an upper light guide structure 145 is formed on the plurality of light filters 142. In some embodiments, the upper light guide structure 145 comprises a plurality of micro-lenses 144.

Figure 36:
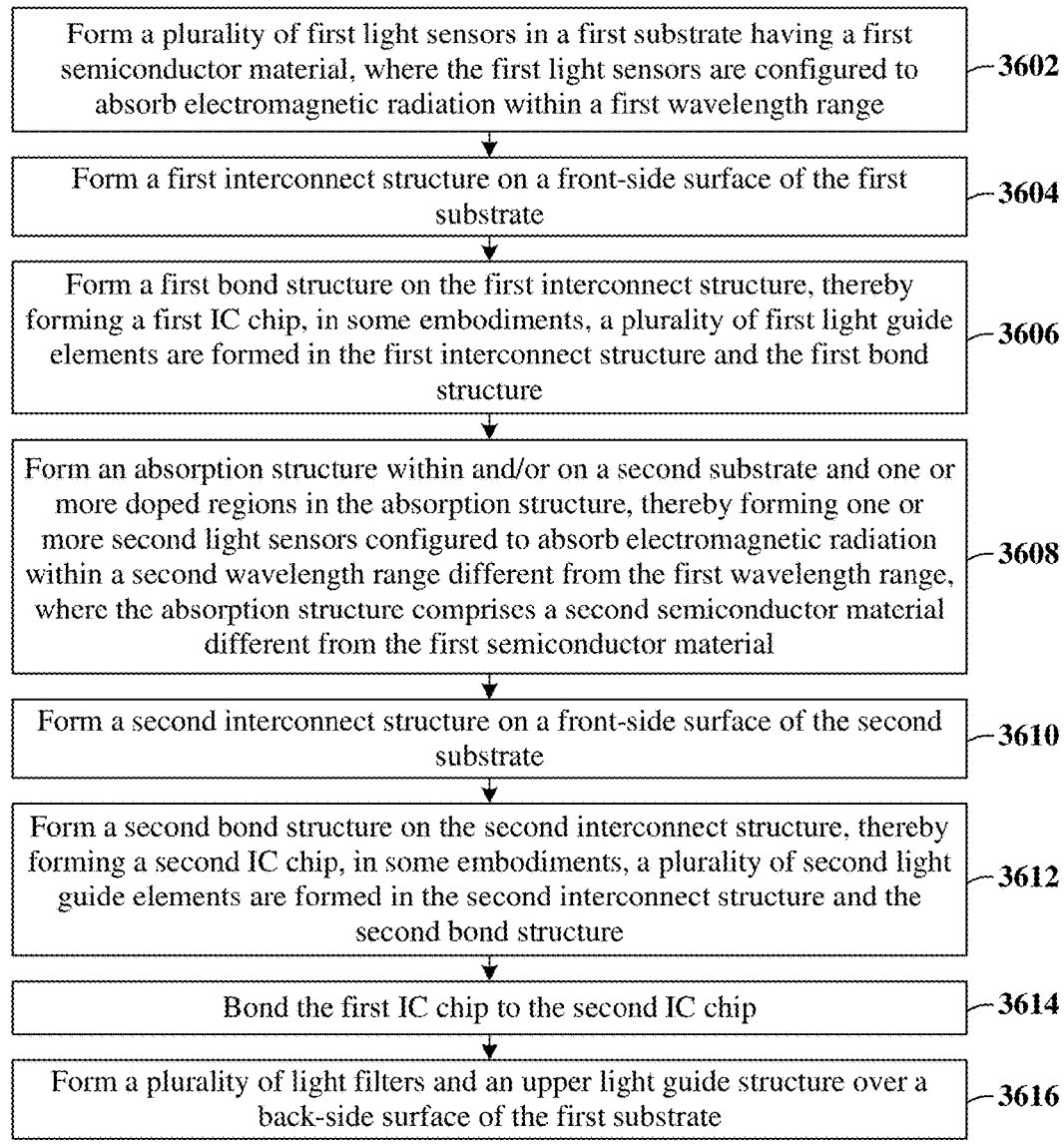
FIG. 36 illustrates a flow diagram of some embodiments of a method for forming a stacked IC structure comprising a first light sensor over a second light sensor, where the first and second light sensors are configured to absorb different wavelength ranges of electromagnetic radiation.

FIG. 36 illustrates a flow diagram of some embodiments of a method 3600 for forming a stacked IC structure comprising a first light sensor over a second light sensor, where the first and second light sensors are configured to absorb different wavelength ranges of electromagnetic radiation. Although the method 3600 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 3602, a plurality of first light sensors are formed in a first substrate having a first semiconductor material, where the first light sensors are configured to absorb electromagnetic radiation within a first wavelength range. FIG. 5 illustrates cross-sectional view 500 corresponding to various embodiments of act 3602.

At act 3604, a first interconnect structure is formed on a front-side surface of the first substrate. FIGS. 8 and 9 illustrate cross-sectional views 800 and 900 corresponding to various embodiments of act 3604.

At act 3606, a first bond structure is formed on the first interconnect structure, thereby forming a first IC chip. In some embodiments, a plurality of first light guide elements are formed in the first interconnect structure and the first bond structure. FIG. 9 illustrates cross-sectional view 900 corresponding to various embodiments of act 3606. FIGS. 18-20 illustrate cross-sectional views 1800-2000 corresponding to some other embodiments of act 3606.

At act 3608, an absorption structure is formed within and/or on a second substrate and one or more doped regions are formed in the absorption structure, thereby forming one or more second light sensors configured to absorb electromagnetic radiation within a second wavelength range different from the first wavelength range. The absorption structure comprises a second semiconductor material different from the first semiconductor material. FIGS. 10-12 illustrate cross-sectional views 1000-1200 corresponding to some embodiments of act 3608. FIGS. 25-27 illustrate cross-sectional views 2500-2700 corresponding to some other embodiments of act 3608.

At act 3610, a second interconnect structure is formed on a front-side surface of the second substrate. FIGS. 12 and 13 illustrate cross-sectional views 1200 and 1300 corresponding to various embodiments of act 3610.

At act 3612, a second bond structure is formed on the second interconnect structure, thereby forming a second IC chip. In some embodiments, a plurality of second light guide elements are formed in the second interconnect structure and the second bond structure. FIG. 13 illustrates cross-sectional view 1300 corresponding to various embodiments of act 3612. FIGS. 21 and 22 illustrate cross-sectional views 2100 and 2200 corresponding to some other embodiments of act 3612. FIGS. 31-33 illustrate cross-sectional views 3100-3300 corresponding to yet further embodiments of act 3612.

At act 3614, the first IC chip is bonded to the second IC chip. FIG. 14 illustrates cross-sectional view 1400 corresponding to various embodiments of act 3614. FIG. 23 illustrates cross-sectional view 2300 corresponding to some embodiments of act 3614. FIG. 29 illustrates cross-sectional view 2900 corresponding to some other embodiments of act 3614. FIG. 34 illustrates cross-sectional view 3400 corresponding to yet further embodiments of act 3614.

At act 3616, a plurality of light filters and an upper light guide structure are formed over a back-side surface of the first substrate. FIGS. 16 and 17 illustrate cross-sectional views 1600 and 1700 corresponding to some embodiments of act 3616. FIG. 24 illustrates cross-sectional view 2400 corresponding to various embodiments of act 3616. FIG. 30 illustrates cross-sectional view 3000 corresponding to some other embodiments of act 3616. FIG. 35 illustrates cross-sectional view 3500 corresponding to yet further embodiments of act 3616.

Accordingly, in some embodiments, the present disclosure relates to a stacked IC structure comprising a first IC chip having a first light sensor and a second IC chip bonded to the first IC chip and comprising a second light sensor, where the first and second light sensors are configured to absorb different wavelength ranges of electromagnetic radiation.

In some embodiments, the present application provides a semiconductor structure including: a first substrate comprising a first semiconductor material; a first light sensor disposed within the first substrate, wherein the first light sensor is configured to absorb electromagnetic radiation within a first wavelength range; and a second light sensor disposed within an absorption structure underlying the first substrate, wherein the second light sensor is configured to absorb electromagnetic radiation within a second wavelength range different from the first wavelength range, wherein the absorption structure underlies the first light sensor and comprises a second semiconductor material different from the first semiconductor material. In an embodiment, the first light sensor comprises a doped photodetector region in the first substrate, wherein the doped photodetector region is spaced between opposing sidewalls of the absorption structure. In an embodiment, the second light sensor comprises a first doped region and a second doped region disposed within the absorption structure, wherein the doped photodetector region is spaced laterally between the first and second doped regions. In an embodiment, the semiconductor structure further includes: a second substrate underlying the first substrate, wherein the absorption structure is disposed within or on the second substrate; a first interconnect structure disposed on a front-side surface of the first substrate; and a second interconnect structure disposed on a front-side surface of the second substrate, wherein the first interconnect structure is electrically coupled to the second interconnect structure; wherein the first and second interconnect structures respectively comprise a plurality of conductive wires and a plurality of conductive vias disposed within a dielectric structure, wherein the conductive wires and vias of the first and second interconnect structures are completely laterally offset from a light guide region that continuously extends vertically from the first light sensor to the second light sensor. In an embodiment, the semiconductor structure further includes: a first light guide element disposed in the first interconnect structure and spaced within an upper portion of the light guide region; and a second light guide element disposed in the second interconnect structure and spaced within a lower portion of the light guide region, wherein the first light guide element directly contacts the second light guide element. In an embodiment, a width of the first light guide element continuously increases from the front-side surface of the first substrate in a first direction towards the second substrate, wherein a width of the second light guide element continuously decrease from a bottom surface of the first light guide element in the first direction. In an embodiment, the first light guide element directly contacts the first substrate, wherein a capping layer is disposed on the absorption structure, and wherein the second light guide element directly contacts the capping layer. In an embodiment, the semiconductor structure further includes a plurality of light filters overlying the first substrate; and a plurality of lenses disposed on the light filters.

In some embodiments, the present application provides a stacked integrated chip (IC) structure including: a first IC chip comprising a first interconnect structure disposed on a front-side surface of a first substrate, a plurality of first light sensors disposed in the first substrate, and a first bond structure on the first interconnect structure, wherein the first substrate comprises silicon, wherein the first light sensors respectively comprise a doped photodetector region of the first substrate; and a second IC chip underlying the first IC chip, wherein the second IC chip comprises a second interconnect structure disposed on a front-side surface of a second substrate, a plurality of second light sensors disposed on the second substrate, and a second bond structure on the second interconnect structure, wherein a bond interface is disposed between the first and second IC chips, wherein the second light sensors respectively comprise one or more doped regions disposed within a germanium structure. In an embodiment, the one or more doped regions are electrically coupled to the first interconnect structure by way of the second interconnect structure and the second bond structure. In an embodiment, the germanium structure is disposed within the second substrate and has a top surface recessed below the front-side surface of the second substrate. In an embodiment, the stacked IC structure further includes a capping layer disposed along the top surface of the germanium structure, wherein the capping layer comprises silicon. In an embodiment, the stacked IC structure further includes a plurality of light pipe structures disposed within the first and second IC chips, wherein the light pipe structures vertically extend from the first substrate to the second light sensors. In an embodiment, a height of the light pipe structures is at least equal to a distance between the front-side surface of the first substrate and the front-side surface of the second substrate. In an embodiment, the stacked IC structure further includes a plurality of floating diffusion nodes disposed within the first substrate, wherein the floating diffusion nodes are adjacent to a corresponding doped photodetector region; and a plurality of pixel devices disposed on the front-side surface of the first substrate, wherein the plurality of pixel devices directly overlie the germanium structure.

In various embodiments, the present application provides a method for forming a stacked integrated chip (IC) structure, the method includes: doping a first substrate to form a plurality of first light sensors within the first substrate, wherein the first light sensors are configured to absorb electromagnetic radiation within a first wavelength range; forming a first interconnect structure on a front-side surface of the first substrate; forming a first bond structure on the first interconnect structure; forming a plurality of second light sensors within a second substrate, wherein the plurality of second light sensors are configured to absorb electromagnetic radiation within a second wavelength range different from the first wavelength range; forming a second interconnect structure on a front-side surface of the second substrate; forming a second bond structure on the second interconnect structure; and performing a bonding process to bond the first bond structure to the second bond structure, wherein the first light sensors directly overlie the second light sensors. In an embodiment, forming the second light sensors includes forming an absorption structure on the second substrate; and doping the absorption structure to form a first doped region vertically separated from a second doped region within the absorption structure. In an embodiment, forming the absorption structure includes etching the second substrate to form a recess extending into the front-side surface of the second substrate; and depositing the absorption structure within the recess. In an embodiment, forming the absorption structure includes depositing an absorption layer along the front-side surface of the second substrate; etching the absorption layer, thereby defining the absorption structure; and depositing a dielectric layer over the second substrate and around the absorption structure. In an embodiment, the method further includes forming a plurality of first light guide elements within the first interconnect structure and the first bond structure; and forming a plurality of second light guide elements within the second interconnect structure and the second bond structure; wherein after the bonding process the plurality of first light guide elements meet the plurality of second light guide elements at a dielectric-to-dielectric bond interface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first substrate comprising a first semiconductor material;
a first interconnect structure disposed on a front-side surface of the first substrate;
a first light sensor disposed within the first substrate, wherein the first light sensor is configured to absorb electromagnetic radiation within a first wavelength range;
a second substrate underlying the first substrate;
a second interconnect structure disposed on a front-side surface of the second substrate, wherein the first interconnect structure is disposed on and electrically coupled to the second interconnect structure; and
a second light sensor disposed within an absorption structure, wherein the absorption structure is disposed within or on the second substrate, wherein the second light sensor is configured to absorb electromagnetic radiation within a second wavelength range different from the first wavelength range, wherein the absorption structure underlies the first light sensor and comprises a second semiconductor material different from the first semiconductor material.

2. The semiconductor structure of claim 1, wherein the first light sensor comprises a doped photodetector region in the first substrate, wherein the doped photodetector region is spaced between opposing sidewalls of the absorption structure.

3. The semiconductor structure of claim 2, wherein the second light sensor comprises a first doped region and a second doped region disposed within the absorption structure, wherein the doped photodetector region is spaced laterally between the first and second doped regions.

4. The semiconductor structure of claim 1, wherein the first and second interconnect structures respectively comprise a plurality of conductive wires and a plurality of conductive vias disposed within a dielectric structure, wherein the conductive wires and vias of the first and second interconnect structures are laterally offset from a light guide region that continuously extends vertically from the first light sensor to the second light sensor.

5. The semiconductor structure of claim 4, further comprising:
a first light guide element disposed in the first interconnect structure and spaced within an upper portion of the light guide region; and
a second light guide element disposed in the second interconnect structure and spaced within a lower portion of the light guide region, wherein the first light guide element directly contacts the second light guide element.

6. The semiconductor structure of claim 5, wherein a width of the first light guide element continuously increases from the front-side surface of the first substrate in a first direction towards the second substrate, wherein a width of the second light guide element continuously decreases from a bottom surface of the first light guide element in the first direction.

7. The semiconductor structure of claim 5, wherein the first light guide element directly contacts the first substrate, wherein a capping layer is disposed on the absorption structure, and wherein the second light guide element directly contacts the capping layer.

8. The semiconductor structure of claim 1, further comprising:
a plurality of light filters overlying the first substrate; and
a plurality of lenses disposed on the light filters.

9. A stacked integrated chip (IC) structure, comprising:
a first IC chip comprising a first interconnect structure disposed on a front-side surface of a first substrate, a plurality of first light sensors disposed in the first substrate, and a first bond structure on the first interconnect structure, wherein the first substrate comprises silicon, wherein the first light sensors respectively comprise a doped photodetector region of the first substrate; and
a second IC chip underlying the first IC chip, wherein the second IC chip comprises a second interconnect structure disposed on a front-side surface of a second substrate, a plurality of second light sensors disposed on the second substrate, and a second bond structure on the second interconnect structure, wherein a bond interface is disposed between the first and second IC chips, wherein the second light sensors respectively comprise one or more doped regions disposed within a germanium structure.

10. The stacked IC structure of claim 9, wherein the one or more doped regions are electrically coupled to the first interconnect structure by way of the second interconnect structure and the second bond structure.

11. The stacked IC structure of claim 9, wherein the germanium structure is disposed within the second substrate and has a top surface recessed below the front-side surface of the second substrate.

12. The stacked IC structure of claim 11, further comprising:
a capping layer disposed along the top surface of the germanium structure, wherein the capping layer comprises silicon.

13. The stacked IC structure of claim 9, further comprising:

a plurality of light pipe structures disposed within the first and second IC chips, wherein the light pipe structures vertically extend from the first substrate to the second light sensors.

14. The stacked IC structure of claim 13, wherein a height of the light pipe structures is at least equal to a distance between the front-side surface of the first substrate and the front-side surface of the second substrate.

15. The stacked IC structure of claim 9, further comprising:
- a plurality of floating diffusion nodes disposed within the first substrate, wherein the floating diffusion nodes are adjacent to a corresponding doped photodetector region; and
- a plurality of pixel devices disposed on the front-side surface of the first substrate, wherein the plurality of pixel devices directly overlie the germanium structure.

16. A method for forming a stacked integrated chip (IC) structure, comprising:
- doping a first substrate to form a plurality of first light sensors within the first substrate, wherein the first light sensors are configured to absorb electromagnetic radiation within a first wavelength range;
- forming a first interconnect structure on a front-side surface of the first substrate;
- forming a first bond structure on the first interconnect structure;
- forming a plurality of second light sensors within a second substrate, wherein the plurality of second light sensors are configured to absorb electromagnetic radiation within a second wavelength range different from the first wavelength range;
- forming a second interconnect structure on a front-side surface of the second substrate;
- forming a second bond structure on the second interconnect structure; and
- performing a bonding process to bond the first bond structure to the second bond structure, wherein the first light sensors directly overlie the second light sensors.

17. The method of claim 16, wherein forming the second light sensors comprises:
- forming an absorption structure on the second substrate; and
- doping the absorption structure to form a first doped region laterally separated from a second doped region within the absorption structure.

18. The method of claim 17, wherein forming the absorption structure comprises:
- etching the second substrate to form a recess extending into the front-side surface of the second substrate; and
- depositing the absorption structure within the recess.

19. The method of claim 17, wherein forming the absorption structure comprises:
- depositing an absorption layer along the front-side surface of the second substrate;
- etching the absorption layer, thereby defining the absorption structure; and
- depositing a dielectric layer over the second substrate and around the absorption structure.

20. The method of claim 16, further comprising:
- forming a plurality of first light guide elements within the first interconnect structure and the first bond structure; and
- forming a plurality of second light guide elements within the second interconnect structure and the second bond structure;
- wherein after the bonding process the plurality of first light guide elements meet the plurality of second light guide elements at a dielectric-to-dielectric bond interface.

* * * * *